(12) United States Patent
Wang et al.

(10) Patent No.: US 12,707,956 B2
(45) Date of Patent: Aug. 11, 2026

(54) MEMORY DEVICE HAVING BACKSIDE POWER VIAS

(71) Applicant: Taiwan Semiconductor Manufacturing Company, Ltd., Hsin-Chu (TW)

(72) Inventors: Ping-Wei Wang, Hsin-Chu (TW); Jui-Lin Chen, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 378 days.

(21) Appl. No.: 18/454,963

(22) Filed: Aug. 24, 2023

(65) Prior Publication Data

US 2025/0069991 A1 Feb. 27, 2025

(51) Int. Cl.

| | |
|---|---|
| ***H10W 20/20*** | (2026.01) |
| ***H10B 10/00*** | (2023.01) |
| ***H10D 30/43*** | (2025.01) |
| ***H10D 30/67*** | (2025.01) |
| ***H10D 62/10*** | (2025.01) |

(52) U.S. Cl.

CPC .......... *H10W 20/20* (2026.01); *H10B 10/125* (2023.02); *H10D 30/43* (2025.01); *H10D 30/6729* (2025.01); *H10D 30/6757* (2025.01); *H10D 62/121* (2025.01)

(58) Field of Classification Search

None

See application file for complete search history.

(56) References Cited

U.S. PATENT DOCUMENTS

| | | | | |
|---|---|---|---|---|
| 11,121,078 | B2 | 9/2021 | Chen et al. | |
| 2018/0219077 | A1* | 8/2018 | Wang | H10D 62/832 |
| 2019/0326300 | A1* | 10/2019 | Liaw | H10B 10/12 |
| 2022/0230925 | A1* | 7/2022 | More | H10D 84/038 |

OTHER PUBLICATIONS

Chen et al., "Memory Device With Jogged Backside Metal Lines," U.S. Appl. No. 17/890,762, filed Aug. 18, 2022, Assignee: Taiwan Semiconductor Manufacturing Company, Ltd., 25 pages specification, 9 pages drawings.

* cited by examiner

*Primary Examiner* — Khaja Ahmad

(74) *Attorney, Agent, or Firm* — HAYNES AND BOONE, LLP

(57) ABSTRACT

A semiconductor structure includes a first source/drain (S/D) epitaxial feature, a second S/D epitaxial feature adjacent to the first S/D epitaxial feature, an insulating structure between the first and the second S/D epitaxial features, and a shared S/D contact over top surfaces of the first and the second S/D epitaxial features. A center portion of the shared S/D contact is directly between a side surface of the first S/D epitaxial feature and a side surface of the second S/D epitaxial feature. The center portion is directly above the insulating structure. The semiconductor structure further includes a backside via penetrating through the insulating structure to directly land on a bottom surface of the center portion.

20 Claims, 14 Drawing Sheets

100a
x1
s1
x1
y1
PD1
PD1'
PD3
PD3'
Vss
v1
v2
y2
B
B'
Legend
106
108
110
113
y
x
z 100a
110
117
116
106a
109
107
106
120
112
113
111
130
115d
115c
115b
115a
129
115e
x
z
y

MEMORY DEVICE HAVING BACKSIDE POWER VIAS

BACKGROUND

Embedded memory devices, such as embedded static random access memory (SRAM) devices have become a popular storage unit for high speed communication, image processing, and system-on-chip (SOC) products. The amount of embedded SRAM in microprocessors and SOCs increases to meet the performance requirement in each new technology generation. In each new technology generation, there is demand to scale down feature sizes while optimizing power consumption.

One advancement in SRAM technology is providing power line connections to the back side of the SRAM device. In one case, front side power lines are moved to the back side. This provides better spacing management on a front side of the SRAM device. In another case, front side and back side power lines are both provided in a device structure. This dual side power configuration provides benefits to power optimization and consumption. In some cases, dual side power configurations can reduce power consumption by more than 30% for better power performance.

To allow for back side power line connections, backside power vias are formed to electrically connect source/drain features to back side power lines. The backside power vias may be formed by etching backside trenches through source/drain regions of an active region, then metal vias are formed in the trenches to land on the source/drain features. However, when critical dimensions of the source/drain regions become too small, there is risk of missing or not punching through the source/drain regions when etching the trenches. As such, there is risks of open circuit, and the size of the source/drain regions limits the process window.

Therefore, although existing SRAM device structures have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments. Further, the accompanying figures may implicitly describe features not explicitly described in the detailed description.

DETAILED DESCRIPTION

Figure 1:
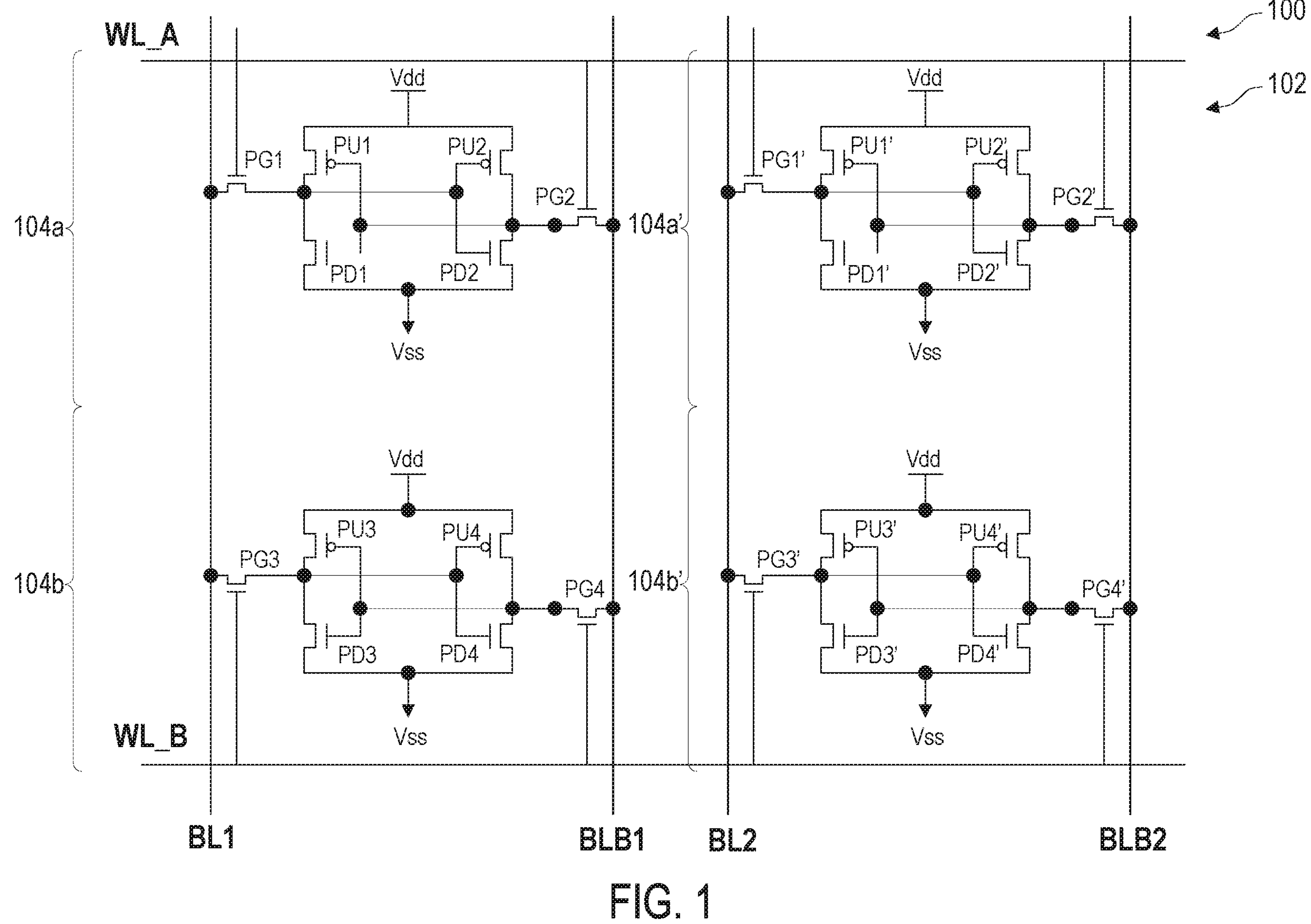
FIG. 1 illustrates a circuit diagram of a semiconductor device having an SRAM array, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximately," and the like, the term is intended to encompass numbers that are within a reasonable range including the number described, such as within +/−10% of the number described, or other values as understood by person skilled in the art. For example, the term "about 5 nm" may encompass the dimension range from 4.5 nm to 5.5 nm. And when comparing a dimension or size of a feature to another feature, the phrases "substantially the same," "essentially the same," "of similar size," and the like, are understood to be within +/−10% between the compared features, or other values as understood by person skilled in the art. Further, disclosed dimensions of the different features can implicitly disclose dimension ratios between the different features.

The present disclosure relates to semiconductor devices having backside vias. Particularly, the present disclosure is directed to static random access memory (SRAM) semiconductor devices having backside power vias landing on source/drain contacts.

An SRAM device is a type of semiconductor memory that uses bi-stable latching circuity (e.g., flip-flop) to store binary bits of information. A semiconductor device may include an SRAM array comprising a plurality of SRAM cells, each cell having a plurality of metal routing lines including power lines that connect to power source or to ground. These power lines are electrically connected to source/drain features, and they provide routing to power pull-up and pull-down transistors of the SRAM device. For these power lines to be on a backside of the SRAM device, backside power vias are formed to electrically connect to source/drain features from the back side. However, as dimensions of transistor active regions continue to decrease, it becomes more difficult to form backside power vias that land on the back side of the source/drain features. Specifically, when critical dimensions of the active region (specifically source/drain regions of the active region) become too small, there is risk of missing or not punching through the active regions from the backside. Further, even when a backside power via is successfully formed, the width of the backside power via would be limited by the width of the active region.

The present disclosure presents a backside via scheme that does not depend on the critical dimensions of the active region. Instead of having the backside via landing on a backside of the source/drain features, the present disclosure contemplates having the backside vias landing on a backside of the source/drain contacts. Source/drain contacts are already formed on a front side of the source/drain features. Therefore, the backside vias can electrically connect to the source/drain features by landing on the source/drain contacts. In this way, the backside vias can be formed larger than the critical dimensions of the active region, thereby avoiding process window concerns. Further, by increasing the size of the backside vias and by directly contacting the source/drain contacts, contact resistance of the SRAM device can be significantly reduced, improving SRAM speed and performance.

Embodiments of the present disclosure can be implemented with planar, FinFET, or gate-all-around (GAA) transistors. GAA transistors refer to transistors having gate stacks (gate electrodes and gate dielectric layers) surrounding transistor channels, such as vertically-stacked gate-all-around horizontal nanowire or nanosheet MOSFET devices. Those of ordinary skill in the art should appreciate that they may readily use the present disclosure as a basis for designing or modifying other structures for carrying out the same purposes and/or achieving the same advantages of the embodiments introduced herein.

FIG. 1 illustrates a circuit diagram of a semiconductor device 100 having an SRAM array 102 according to an embodiment of the present disclosure. The semiconductor device 100 has a corresponding semiconductor structure, and the two terms (i.e., device and structure) may be used interchangeably. The SRAM array 102 includes four SRAM cells 104*a*, 104*a*', 104*b*, and 104*b*'. Each of the four SRAM cells is formed of six transistors (two pull-down transistors, two pull-up transistors, and two pass-gate transistors). Each SRAM cell stores a bit of memory through the pull-down and pull-up transistors, and the SRAM cells are addressed by word lines and bit lines through the pass-gate transistors.

The SRAM cell 104*a* includes pull-up transistors PU1 and PU2, pull-down transistors PD1 and PD2, and pass gate transistors PG1 and PG2. The sources of PU1 and PU2 are coupled together and connected to high voltage Vdd. The sources of PD1 and PD2 are coupled together and connected to low source voltage Vss or ground. The gates of PU1 and PD1 are coupled together and connected to the common drains of PU2, PD2 and PG2. The gates of PU2 and PD2 are coupled together and connected to the common drains of PU1, PD1, and PG1. PU1, PU2, PD1, and PD2 form a first set of cross coupled inverters to store a data bit. The source of PG1 is connected to a first bit line BL1 and the source of PG2 is connected to a first bit line bar BLB1. The gates of PG1 and PG2 are connected to a first word line WL_A.

The SRAM cell 104*b* includes pull-up transistors PU3 and PU4, pull-down transistors PD3 and PD4, and pass gate transistors PG3 and PG4. The sources of PU3 and PU4 are coupled together and connected to high voltage Vdd. The sources of PD3 and PD4 are coupled together and connected to low voltage Vss or ground. The gates of PU3 and PD3 are coupled together and connected to the common drains of PU4, PD4 and PG4. The gates of PU4 and PD4 are coupled together and connected to the common drains of PU3, PD3, and PG3. PU3, PU4, PD3, and PD4 form a second set of cross coupled inverters to store a data bit. The source of PG3 is connected to the same first bit line BL1 and the source of PG4 is connected to the same first bit line bar BLB1. The gates of PG3 and PG4 are connected to a second word line WL_B.

The SRAM cells 104*a*' and 104*b*' are configured similarly to the respective SRAM cells 104*a* and 104*b*. The SRAM cells 104*a*' includes pull-up transistors PU1' and PU2', pull-down transistors PD1' and PD2', and pass gate transistors PG1' and PG2'. The SRAM cell 104*b*' includes pull-up transistors PU3' and PU4', pull-down transistors PD3' and PD4', and pass gate transistors PG3' and PG4'. For the sake of brevity, similar configurations and connections will not be repeated. The SRAM cells 104*a*' and 104*b*' include a third and fourth set of cross coupled inverters that each store a data bit. The sources of PG1' and PG3' are connected to a second bit line BL2. The sources of PG2' and PG4' are connected to a second bit line bar BLB2. The SRAM cell 104*a*' share the same first word line WL_A with the SRAM cell 104*a*, and the SRAM cell 104*b*' share the same second word line WL_B with the SRAM cell 104*b*. That is, the gates of the pass-gate transistors PG1' and PG2' also connect to the first word line WL_A, and the gates of the pass-gate transistors PG3' and PG4' also connect to the second word line WL_B.

Note that FIG. 1 shows an example embodiment of an SRAM array 102, but other configurations may be possible. For example, in other embodiments, source and drain nodes of the different pull-up and pull-down transistors may be flipped. Further, the Vdd and Vss nodes may also be flipped. In other words, in some embodiments, high voltage Vdd may connect to source or to drain in any of the pull-up and pull-down transistors of the SRAM array 102. And in other embodiments, low voltage Vss or ground may connect to source or to drain in any of the pull-up and pull-down transistors of the SRAM array 102. As such, electrical connections to Vdd and to Vss are herein referred to as power lines or power line connections that provide routing to power pull-up and pull-down transistors of the SRAM device 100.

Figure 2:
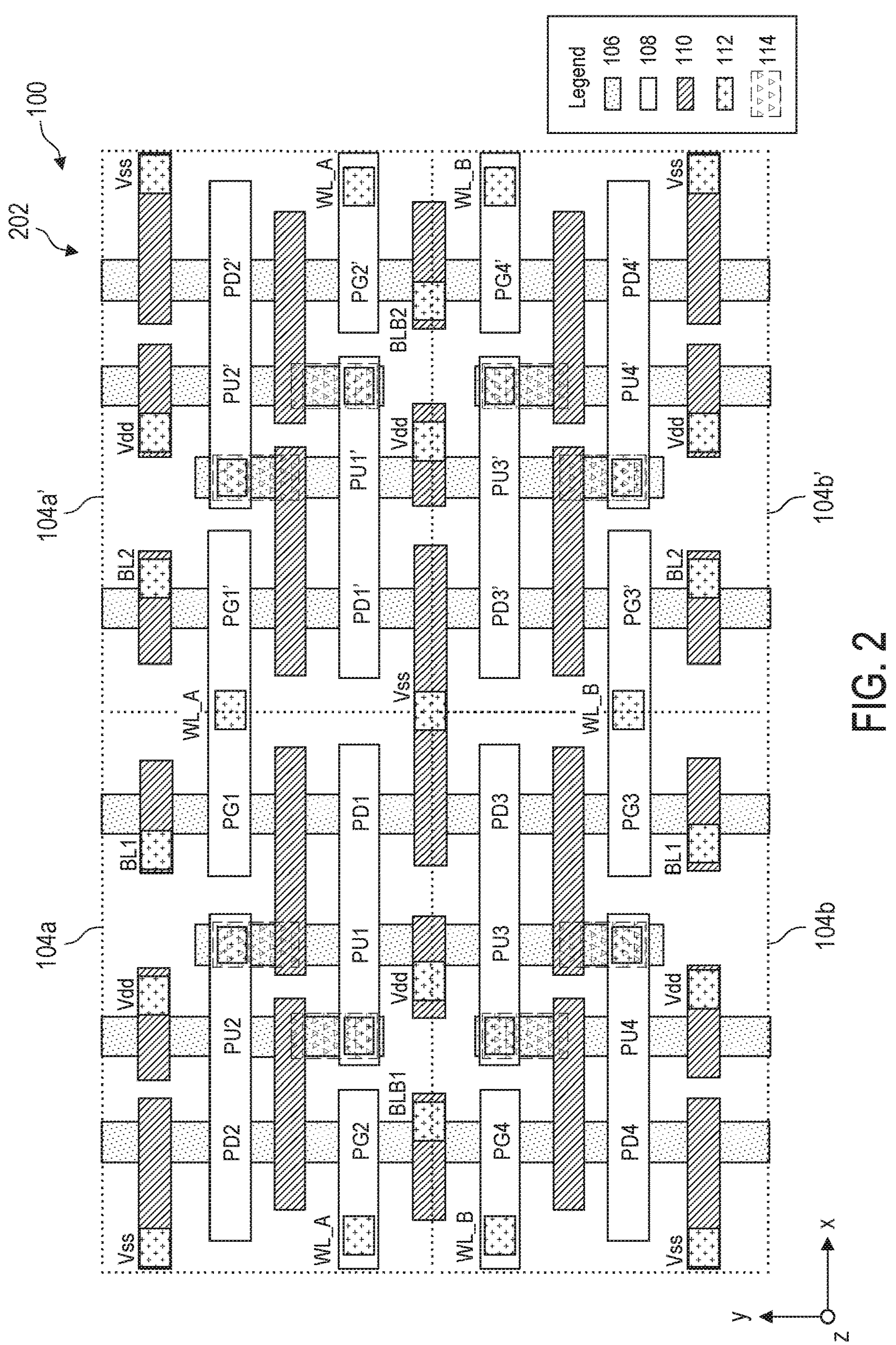
FIG. 2 illustrates a top view device layout showing frontside vias of the semiconductor device in FIG. 1, according to an embodiment of the present disclosure.

FIG. 2 illustrates a top view device layout 202 showing frontside vias 112 (and other features) of the semiconductor device 100. The device layout 202 includes the SRAM cells 104*a*, 104*a*', 104*b*, and 104*b*' defined by the dashed line cell boundaries. The SRAM cells 104*a* and 104*a*' are adjacent to each other in the x direction and mirror each other across a vertical cell boundary between them. The SRAM cells 104*b* and 104*b*' are adjacent to each other in the x direction and mirror each other across a vertical cell boundary between them. The SRAM cells 104*a* and 104*b* are adjacent to each other in the y direction and mirror each other across a horizontal cell boundary between them. The SRAM cells 104*a*' and 104*b*' are adjacent to each other in the y direction and mirror each other across a horizontal cell boundary between them.

FIG. 2 shows where each of the transistors PU1, PU1', PU2, PU2', PU3, PU3', PU4, PU4', PD1, PD1', PD2, PD2', PD3, PD3', PD4, PD4', PG1, PG1', PG2, PG2', PG3, PG3', PG4, and PG4' are located (labeled on the gate 108 of each transistor). How each transistor is connected to each other has already been described with respect to FIG. 1 and will not be repeated here for the sake of brevity.

The device layout 202 includes several active regions 106 extending in the y direction on a front side of the device 100. The active regions 106 may be configured for planar, fin, or gate-all-around semiconductor structures. In an embodiment, the active regions 106 are fin structures that protrude in the positive z direction from a base substrate. Some of the active regions 106 may extend lengthwise across the horizontal cell boundaries so that the same active region is shared across SRAM cells. Several gates 108 are disposed over channel regions of the active regions 106. The channel regions (or transistor channels) refer to portions of the active region 106 directly under a gate 108. The gates 108 extend lengthwise in the x direction. Some of the gates 108 may extend across the vertical cell boundaries to span across active regions of different SRAM cells. Several source/drain (S/D) contacts 110 are disposed over S/D regions of the active regions 106, some of which may couple S/D regions of different transistors together. S/D region(s) may refer to a source or a drain, individually or collectively dependent upon the context.

Several frontside vias 112 are each coupled to one of the gates 108, the active regions 106, or the S/D contacts 110. These vias 112 allow the gates 108, the active regions 106, or the S/D contacts 110 to electrically couple to a higher material layer in the z direction. In FIG. 2, each via 112 is labeled with the name of the node for which the respective via is a part thereof. For example, frontside vias 112 as part of the low voltage Vss or ground nodes are labeled with "Vss" to their sides (also referred to as Vss frontside vias 112) and frontside vias 112 as part of the high voltage Vdd node are labeled with "Vdd" to their sides (also referred to as Vdd frontside vias 112). In the present embodiment, frontside vias 112 as part of WL_A, WL_B, BL1, BL2, BLB1, BLB2, Vss, and Vdd are located on a front side of the semiconductor device 100.

In the present embodiment, there are also eight gate-to-drain contacts 114 that couple gates 108 to S/D contacts 110. The gate-to-drain contacts 114 are also referred to as butted contacts. In an embodiment, the interconnection between the drain (or source) to the gate is achieved by a local interconnect (LI) technology. For example, the local interconnect is formed using the gate electrode material, such as polysilicon, metal, or other conductive material used in gate electrode. In this situation, the polysilicon (metal, or other conductive material) is used not only to form gate electrode but also to form interconnect. More particularly, the gate electrode is extended to the targeted drain (or source) region and directly lands on the targeted drain (or source) region. In another example, the butted contacts 114 are elongated contacts oriented in the y direction and are formed simultaneously with other contacts (such as long contacts) in a same procedure that includes dielectric deposition, patterning and metal deposition.

Figure 3:
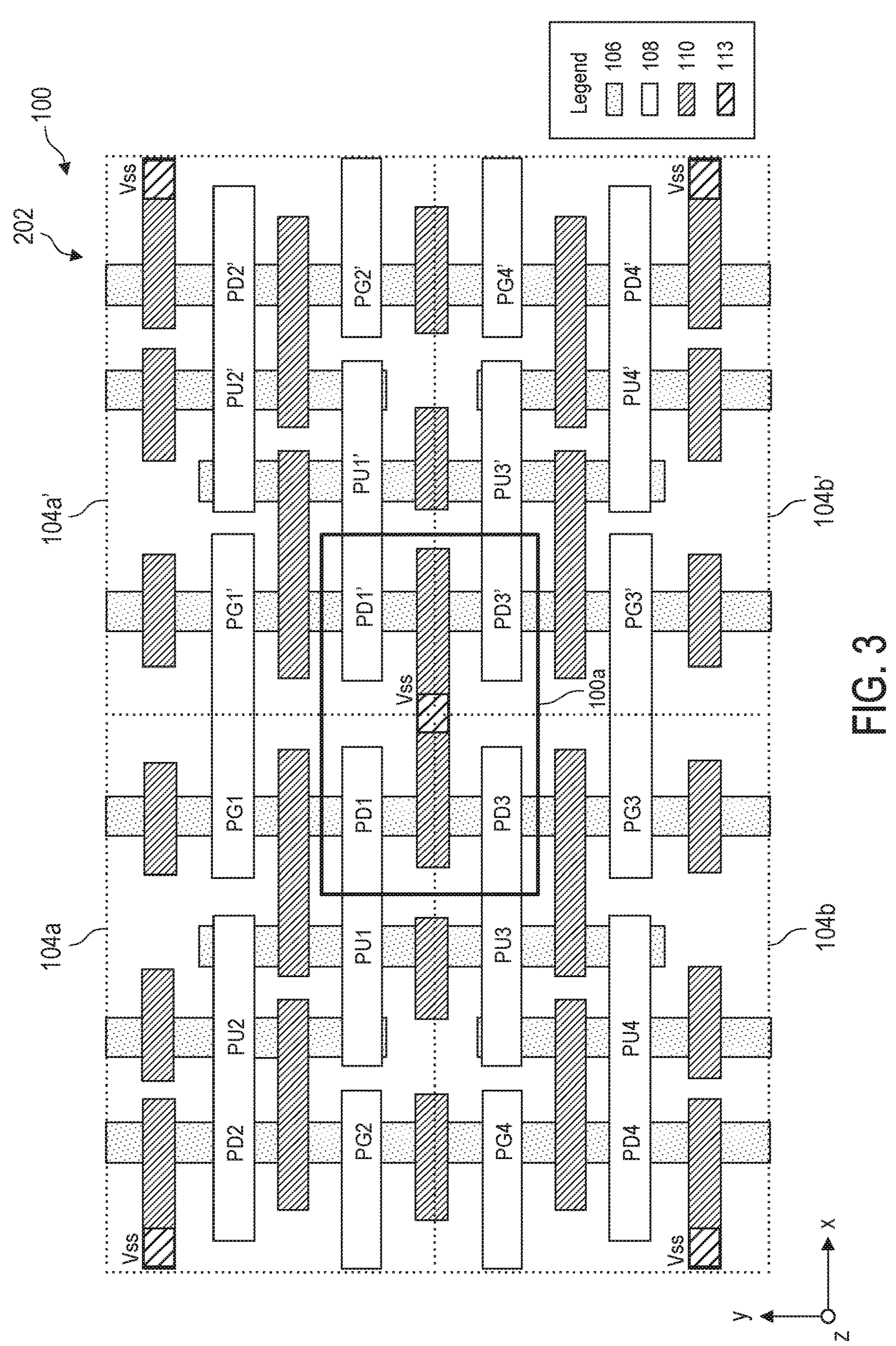
FIG. 3 illustrates a top view device layout showing backside vias of the semiconductor device in FIG. 1, according to an embodiment of the present disclosure.

FIG. 3 illustrates a top view device layout 202 showing backside vias 113 (and other features) of the semiconductor device 100 in FIG. 1. FIG. 3 corresponds to FIG. 2, and the similar features will not be repeated for the sake of brevity. The difference is that FIG. 3 shows backside vias 113 and that the frontside vias 112 and the gate-to-drain contacts 114 from FIG. 2 are filtered out (for simplification). In FIG. 3, each backside via 113 is labeled with the name of the node for which the respective via is a part thereof. As shown, backside vias 113 as part of the low voltage Vss or ground nodes are labeled with "Vss" to their sides (also referred to as Vss backside vias 113). In the present embodiment, the backside vias 113 are located on a back side of the semiconductor device 100 opposite from the front side of the semiconductor device 100. The Vss backside vias 113 provide backside power line connections to the pull-down transistors and may connect to a power source or to ground. In an embodiment, the semiconductor device 100 may include both Vss backside vias 113 and Vss frontside vias 112 (see FIG. 2) for dual side power configurations.

Figures 3A, 3B:
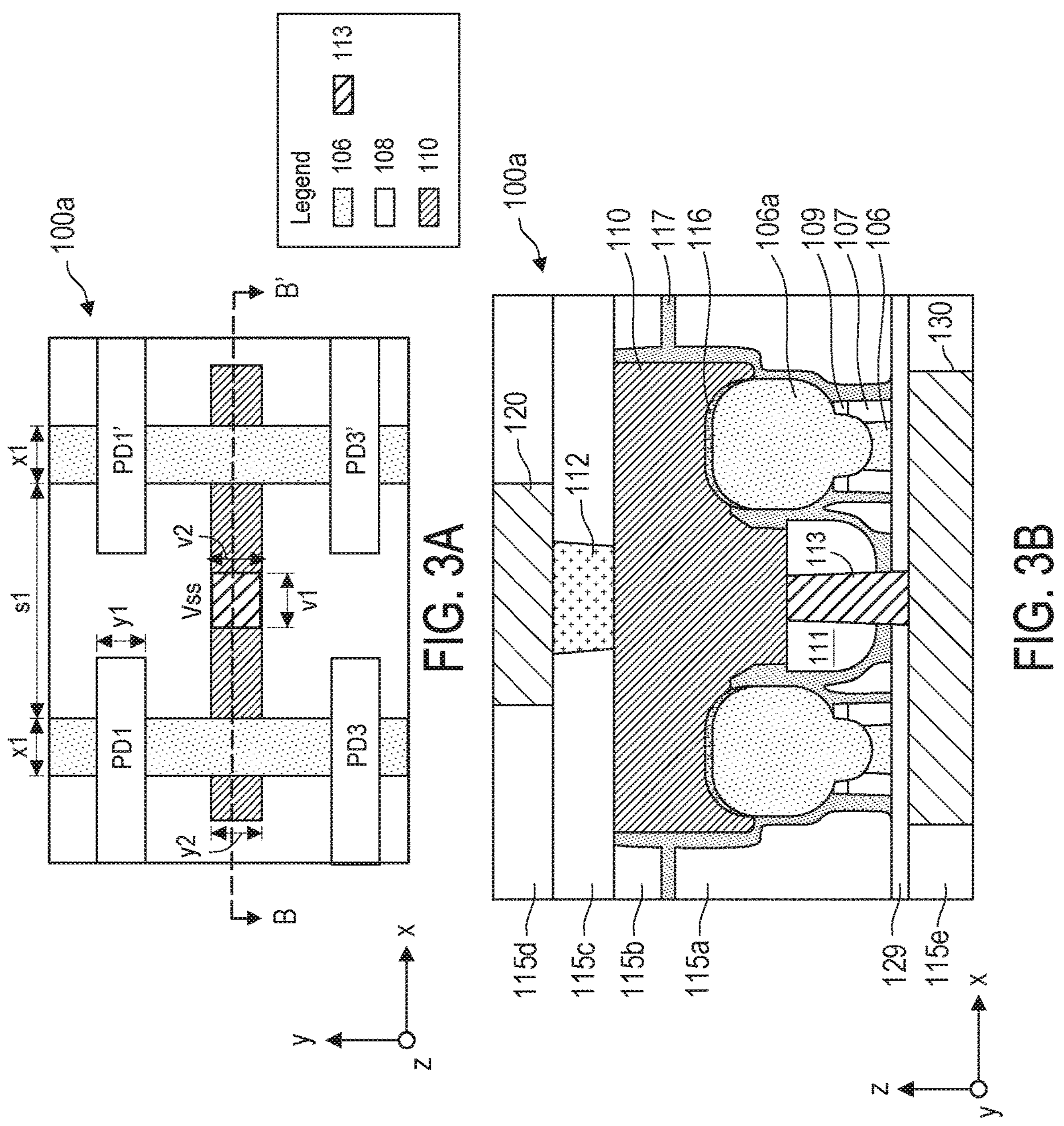
FIG. 3A illustrates a portion of the top view device layout in FIG. 3.
FIG. 3B illustrates a cross-sectional view of a semiconductor device cut along the lines B-B' in FIG. 3A.

FIG. 3 shows a solid black box 100*a* in a middle region of the four SRAM cells to highlight a portion of the semiconductor device 100 having a Vss backside via 113. FIG. 3A illustrates the solid black box 100*a* in FIG. 3, and FIG. 3B illustrates a cross-sectional view of a semiconductor device structure corresponding to the solid black box 100*a*, cut along the lines B-B' in FIG. 3A.

Referring now to FIG. 3A, a shared S/D contact 110 is disposed over adjacent active regions 106. The adjacent active regions 106 may be fin active regions in separate SRAM cells, and each of the fin active regions 106 extends lengthwise in the y direction. The gates 108 extends lengthwise in the x direction and are directly over channel regions of the fin active regions 106. The gates 108 may include gate spacers over sidewalls of gate electrodes (not shown). The gate spacers may include silicon oxide, silicon nitride, silicon oxycarbide, silicon oxycarbonitride, silicon carbonitride, metal nitride, or a suitable dielectric material. The shared S/D contact 110 extends lengthwise in the x direction and are directly over S/D regions of the fin active regions 106. A Vss backside via 113 directly lands on a backside of the shared S/D contact 110 and is disposed between the two adjacent fin active regions 106. The purpose of the Vss backside via 113 is to electrically connect to S/D features 106*a* (see FIG. 3B) from a back side of the semiconductor device 100. This may be achieved by directly contacting the S/D features 106a by penetrating through the fin active regions 106 from a back side (not shown), or by directly contacting the shared S/D contact 110 by penetrating through a gate insulating structure 111 from a back side (shown in FIG. 3B).

Referring to FIG. 3A, the active regions 106 have a width x1 in the x direction, and the Vss backside via 113 has a via length v1 in the x direction. In the embodiment shown, the width x1 and the via length v1 have similar dimensions. For example, both x1 and v1 are about 10 nm such that a ratio of v1 to x1 is about 1. Although the active regions 106 and the Vss backside via 113 have similar dimensions along the x direction, by having the Vss backside via 113 land on the backside of the shared S/D contact 110, there is improved overlay control and process window. This is because the Vss backside via 113 would no longer be limited to the precise location of the fin active regions 106, where any misalignment will cause overlay shift and inadequate landing. In other words, instead of having to penetrate through backside of fin active regions 106, the position of the Vss backside via 113 is relocated to be between the fin active regions 106, thereby achieving overlay improvements.

Still referring to FIG. 3A, the gates 108 have a width y1 in the y direction, the shared S/D contact 110 has a width y2 in the y direction, and the Vss backside via 113 has a via width v2 in the y direction. In an embodiment, a ratio of the via width v2 to the width y1 is in a range between about 0.3 to about 2. In an embodiment, a ratio of the via width v2 to the width y2 is in a range between about 0.5 to about 2. To improve surface contact, in the present embodiment, the via width v2 may be about equal to or greater than the width y2. For example, a ratio of the via width v2 to the width y2 is about equal or greater than 1. A spacing s1 separates the two adjacent active regions 106, and the spacing s1 is greater than the width x1. The shared S/D contact 110 spans across the spacing s1 and beyond outer side surfaces of the active regions 106 on both sides. In other words, the shared S/D contact 110 has a length in the x direction greater than 2 times x1 plus s1. In an embodiment, a ratio of the spacing s1 to the width x1 is in a range between 4 to 5.

Referring now to FIG. 3B, a cross-sectional view of FIG. 3A through the dashed lines B-B' is shown. Features described in FIG. 3A are similarly labeled in FIG. 3B. What has been described in FIG. 3A equally apply in FIG. 3B. Note that there are also additional features shown in FIG. 3B not shown in FIG. 3A. As previously described, active regions 106 may be fin active regions protruding from a substrate (not shown). After processing from the backside, the substrate may be thinned down from a backside such that only portions of the fin active regions 106 remain. As such, FIG. 3B shows portions of the remaining fin active regions 106, which are surrounded by isolation structures 107 (such as shallow isolation structures STI). In this cross-section, these remaining fin active regions 106 are S/D regions of the fin active regions 106. The isolation structures 107 provides isolation between the fin active regions 106 and may include silicon oxide, silicon oxynitride, fluorine-doped silicate glass (FSG), a low-k dielectric, combinations thereof, and/or other suitable materials. In some embodiments, above the isolation structures 107 are fin spacers 109 having similar composition to gate spacers described above.

Still referring to FIG. 3B, S/D features 106a are disposed over S/D regions of the fin active regions 106. The S/D features 106a may be epitaxially grown from a top surface of the S/D regions using a suitable epitaxial growth technique. In the embodiment shown, the S/D features 106a are n-type S/D features for pull-down transistors, and they may be doped with n-type dopants such as phosphorous or arsenic. Each of the S/D features 106a may be lined with a frontside silicide layer 116. The respective frontside silicide layers 116 are disposed over respective top surfaces of the S/D features 106a and they interface between epitaxial features of the S/D features 106a and the shared S/D contact 110. The frontside silicide layers may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Still referring to FIG. 3B, an S/D contact 110 (corresponding to the abovementioned shared S/D contact 110) is disposed over top surfaces of a first S/D feature 106a and an adjacent second S/D feature 106a. The S/D contact 110 may directly land on each of the first and second S/D features 106a or on the frontside silicide layers 116 over the first and second S/D features 106a. A center portion of the shared S/D contact 110 is directly between a side surface of the first S/D feature 106a and a side surface of the second S/D feature 106a. The center portion is directly above a gate insulating structure 111 (also known as a cut-metal-gate feature), and the center portion extends downwards to land on the gate insulating structure 111. The center portion has a greater depth in the z direction than portions of the S/D contact 110 that are directly above the first and second S/D features 106a. The gate insulating structure 111 is a dielectric feature extending in the y direction that cuts through metal gate structures to form the different gates 108 (see FIG. 3A). The gate insulating structure 111 includes similar materials as that of the isolation structures 107.

Still referring to FIG. 3B, a backside via 113 (corresponding to the abovementioned Vss backside via 113) directly lands on a back side of the shared S/D contact 110. As shown, the backside via 113 may directly land on a bottom surface of the center portion of the shared S/D contact 110. The backside via 113 penetrates through the gate insulating structure 111 from a backside, and it is disposed between the S/D features 106a and between the S/D regions of the fin active regions 106. The backside via 113 may also penetrate through other features (e.g., etch stop layer 129 and/or liner barrier layers 117 described below).

Still referring to FIG. 3B, the various features described may be surrounded by one or more interlayer dielectric (ILD) layers 115a and 115b. The ILD layers 115a and 115b includes a dielectric material including, for example, silicon oxide, silicon nitride, silicon oxynitride, TEOS formed oxide, PSG, BPSG, low-k dielectric material, other suitable dielectric material, or combinations thereof. In an embodiment, the ILD layers 115a and 115b includes silicon oxide or a low-k dielectric material. The ILD layers 115a and 115b may be lined with various liner barrier layers 117 at an interface between the ILD layers and the various features described (e.g., the shared S/D contact 110, the S/D features 106a, the fin spacers 109, the isolation structures 107, the gate insulating structure 111, and the backside via 113). The liner barrier layers 117 may conformally line these features and may include a dielectric material such as silicon nitride, which may act as an etch stop film. In an embodiment, the liner barrier layers has a different dielectric material than the ILD layers 115a and 115b for etchant selectivity. A separate etch stop layer 129 may be deposited on a backside of the semiconductor device after a backside thin down process. The etch stop layer 129 is a dielectric layer and may be a planar silicon nitride layer that directly contacts the ILD layer 115*a*, the liner barrier layers 117, the isolation structures 107, the fin active regions 106, and the backside via 113. In an embodiment, the ILD layers 115*a* and 115*b* has a different material composition than the isolation structure 107 and the gate insulating structure 111 for etchant selectivity.

Still referring to FIG. 3B, the backside via 113 directly lands on a backside via rail 130 for further electrical routing on the back side of the semiconductor device. And for dual side power configuration, a frontside via 112 directly lands on a front side of the shared S/D contact 110, and a frontside via rail 120 directly lands on the frontside via 112 for further electrical routing on the front side of the semiconductor device. In this case, the frontside via 112 and the backside via 113 are on opposite sides of the shared S/D contact 110. The frontside via 112 may be surrounded by an ILD layer 115*c*, the frontside via rail 120 may be surrounded by an ILD layer 115*d*, and the backside via rail 130 may be surrounded by an ILD layer 115*e*. The ILD layers 115*c*, 115*d*, and 115*e* may have similar material compositions as that of the ILD layers 115*a* and 115*b*. And although not shown, the ILD layers 115*c*, 115*d*, and 115*e* may also be lined with liner barrier layers 117.

Figure 4:
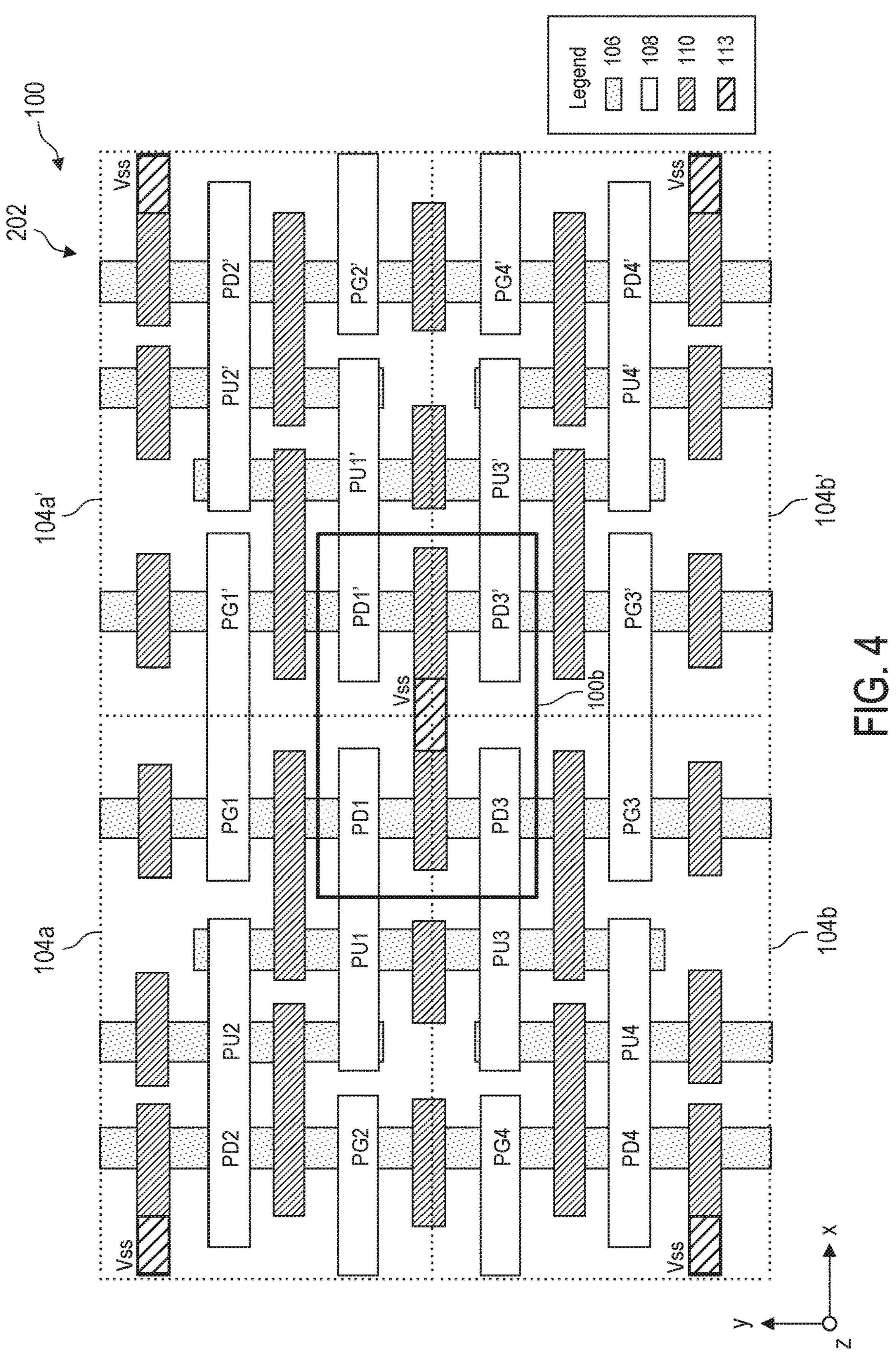
FIG. 4 illustrates a top view device layout showing backside vias of the semiconductor device in FIG. 1, according to another embodiment of the present disclosure.
Figures 4A, 4B:
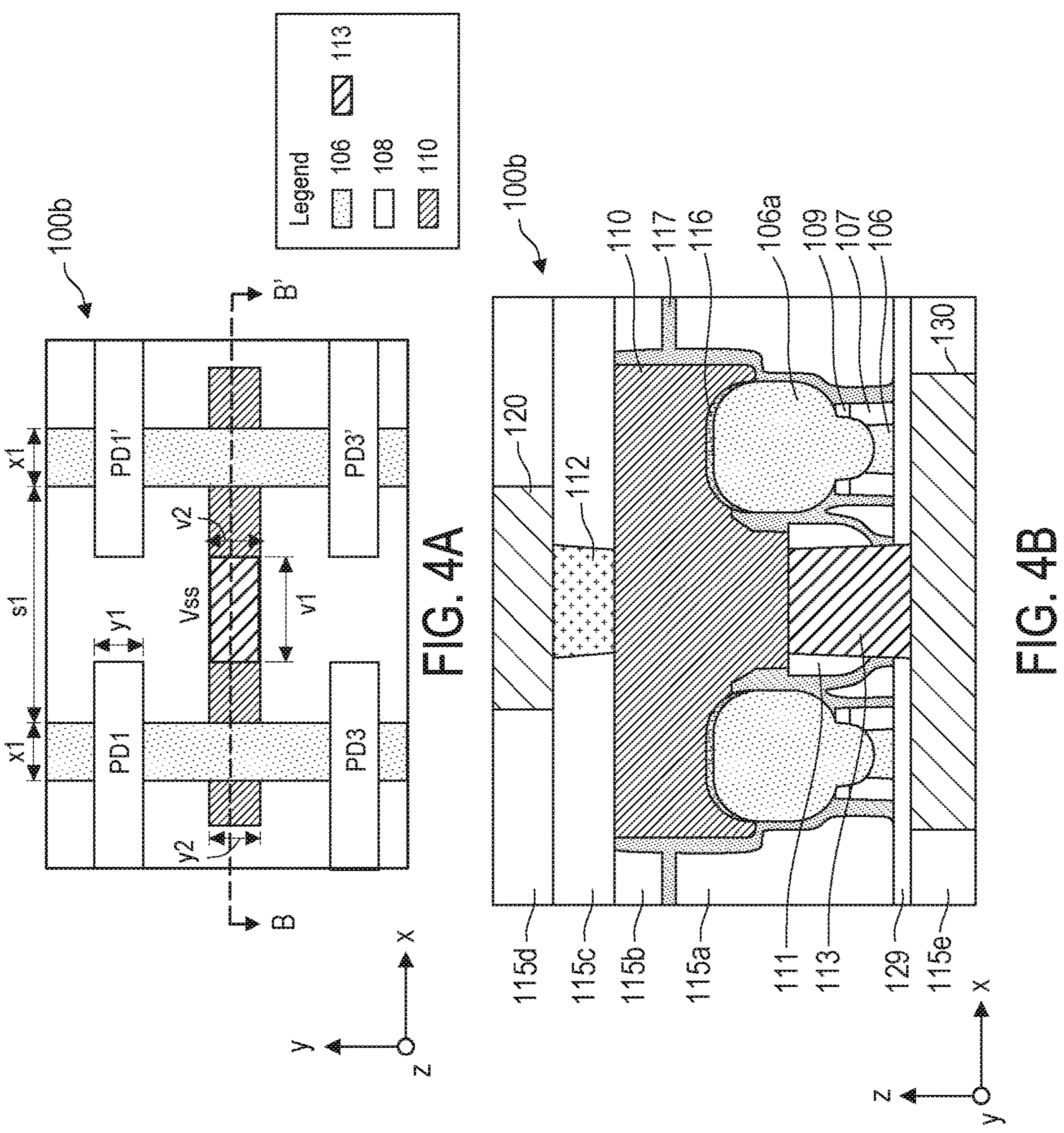
FIG. 4A illustrates a portion of the top view device layout in FIG. 4.
FIG. 4B illustrates a cross-sectional view of a semiconductor device cut along the lines B-B' in FIG. 4A.

FIG. 4 illustrates another embodiment showing backside vias 113 in a top view device layout 202 of a semiconductor device 100. FIG. 4 is similar to FIG. 3 and the similar features will not be repeated for the sake of brevity. The difference is that the size of the backside vias 113 are larger in the x direction. FIG. 4 shows a solid black box 100*b* in a middle region of the four SRAM cells to highlight a portion of the semiconductor device 100 having a Vss backside via 113. FIG. 4A illustrates the solid black box 100*b* in FIG. 4, and FIG. 4B illustrates a cross-sectional view of a semiconductor device structure corresponding to the solid black box 100*b*, cut along the lines B-B' in FIG. 4A.

Referring to FIG. 4A, the active regions 106 have a width x1 in the x direction, and the Vss backside via 113 has a via length v1 in the x direction. In the embodiment shown, the via length v1 is greater than the width x1. For example, a ratio between the via length v1 to the width x1 is in a range between 1.5 to 4. In the present embodiment, instead of being limited by a width x1 of the active regions 106, the via length v1 is limited by a gate separation spacing between gates 108 along the x direction (e.g., spacing between gate 108 for PD1 and gate 108 for PD1'). In an embodiment, the width x1 is about 10 nm and the via length v1 is about 15 nm to about 40 nm. Like in FIG. 3A, by having the Vss backside via 113 land on the backside of the shared S/D contact 110, there is improved overlay control and process window. Further, FIG. 4A demonstrates additional benefits since the longer via length v1 allows for better via penetration and for reduced contact resistance. For example, by increasing the via length v1 to be longer than the width x1, the contact resistance can be reduced by over 50% depending on the amount of via length increase.

Still referring to FIG. 4A, the gates 108 have a width y1 in the y direction, the shared S/D contact 110 has a width y2 in the y direction, and the Vss backside via 113 has a via width v2 in the y direction. A spacing s1 separates the two adjacent active regions 106, and the spacing s1 is greater than the width x1. These dimensions, and other related features, are similar to what has been described with respect to FIG. 3A. For the sake of brevity, the similar features will not be repeated again. Note that although the length v1 is now larger than the width x1, in an embodiment, the length v1 is still smaller than the spacing s1. This is because the gate separation spacing between gates 108 along the x direction (which may limit the length v1) can be smaller than the spacing s1 between two adjacent active regions 106.

Referring now to FIG. 4B, a cross-sectional view of FIG. 4A through the dashed lines B-B' is shown. Features described in FIG. 4A are similarly labeled in FIG. 4B. What has been described in FIG. 4A equally apply in FIG. 4B. Note that there are also additional features shown in FIG. 4B not shown in FIG. 4A.

FIG. 4B is similar to FIG. 3B, and the similar features will not be repeated again for the sake of brevity. The difference is in the backside via 113, which is larger in the x direction when compared to FIG. 3B. As described previously, the backside via 113 directly lands on a back side of the shared S/D contact 110. The backside via 113 penetrates through the gate insulating structure 111 from a backside, and it is disposed between the S/D features 106*a* and between S/D regions of the fin active regions 106. In an embodiment, the length of the backside via 113 (i.e., v1) is limited by the width of the gate insulating structure 111 along the x direction. The width of the gate insulating structure 111 may define the gate separation spacing between gates 108 as described above. In some embodiments, along the x direction and between S/D features 106*a*, over 70% of the gate insulating structure 111 is etched away as part of forming the backside via 113. As such, the backside via 113 may substantially span a width of the gate insulating structure 111 such that a ratio of the via length v1 to a width of the gate insulating structure 111 along the x direction may be greater than 0.7 (e.g., 0.9).

Figure 5:
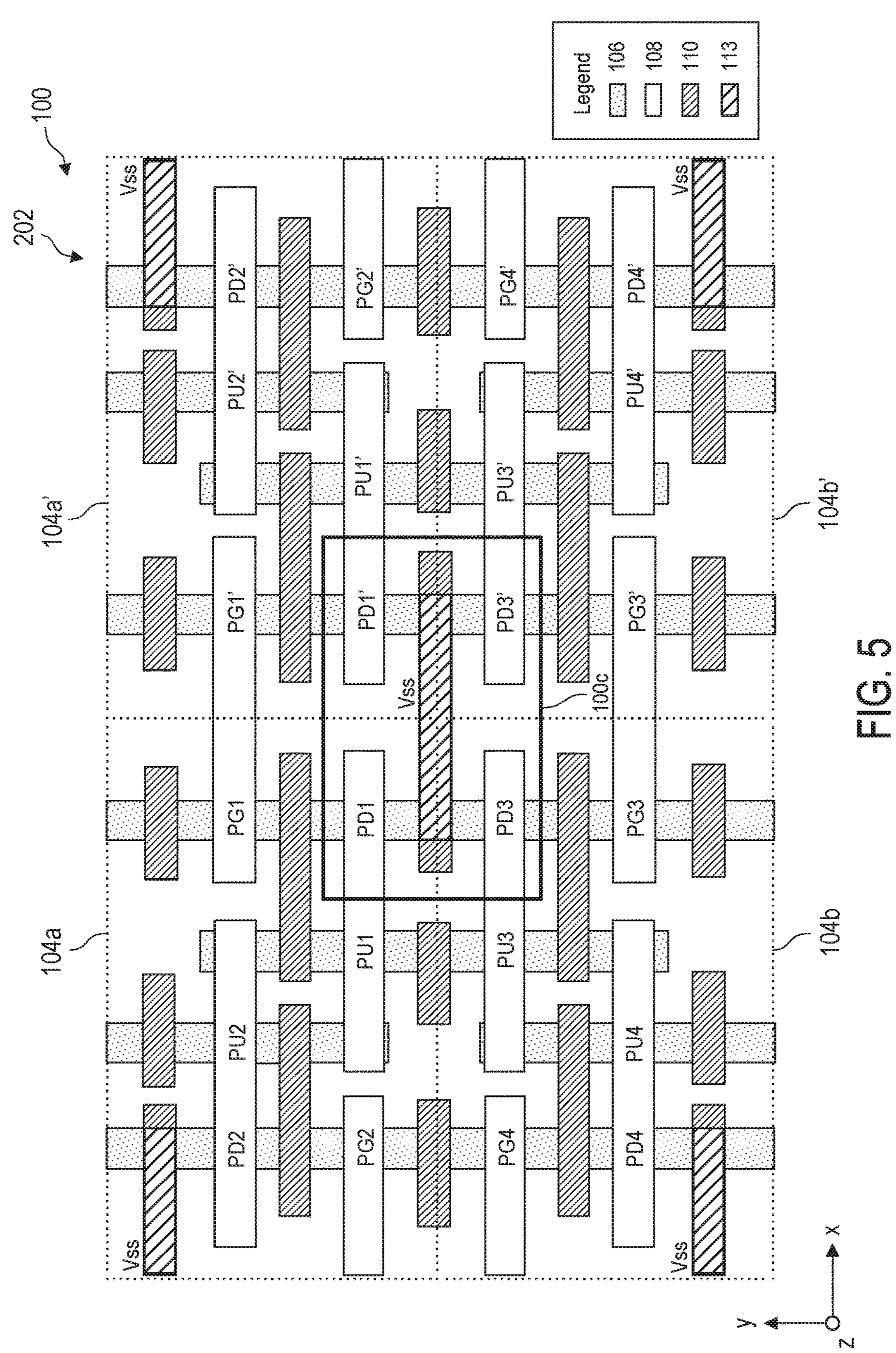
FIG. 5 illustrates a top view device layout showing backside vias of the semiconductor device in FIG. 1, according to another embodiment of the present disclosure.
Figures 5A, 5B:
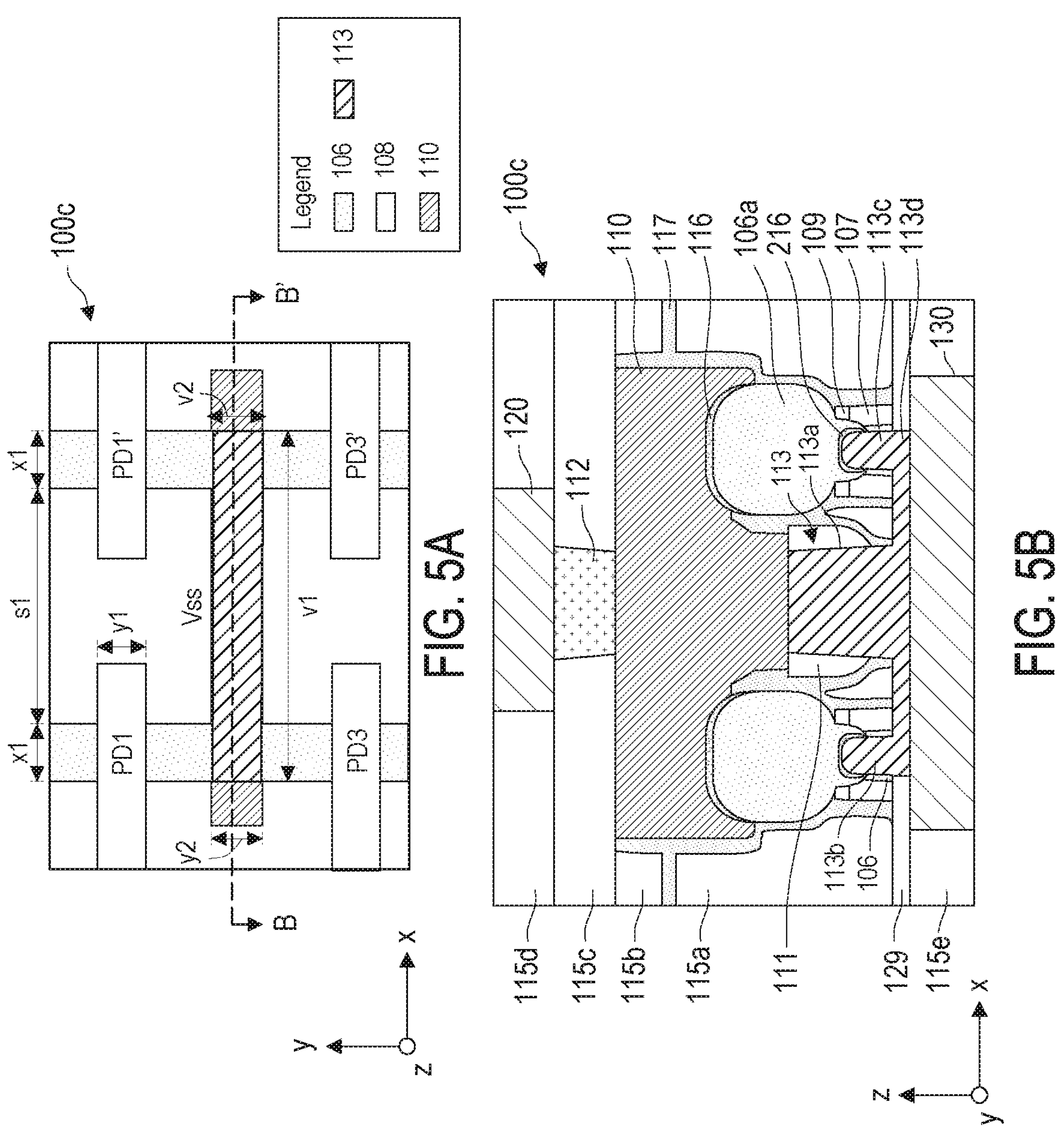
FIG. 5A illustrates a portion of the top view device layout in FIG. 5.
FIG. 5B illustrates a cross-sectional view of a semiconductor device cut along the lines B-B' in FIG. 5A.

FIG. 5 illustrates another embodiment showing backside vias 113 in a top view device layout 202 of a semiconductor device 100. FIG. 5 is similar to FIG. 3 and the similar features will not be repeated for the sake of brevity. The difference is that the backside vias 113 are slot vias that extend between and over the fin active regions 106. As such, the backside vias 113 are even larger in the x direction than the embodiments shown in FIGS. 4, 4A, and 4B. FIG. 5 shows a solid black box 100*c* in a middle region of the four SRAM cells to highlight a portion of the semiconductor device 100 having a Vss backside via 113. FIG. 5A illustrates the solid black box 100*c* in FIG. 4, and FIG. 5B illustrates a cross-sectional view of a semiconductor device structure corresponding to the solid black box 100*c*, cut along the lines B-B' in FIG. 5A.

Referring to FIG. 5A, the active regions 106 have a width x1 and they are separated from each other by a spacing s1. The width x1 and the spacing s1 are in the x direction. In this embodiment, the Vss backside via 113 has a via length v1 about equal to the spacing s1 plus two times the width x1. In other words, the Vss backside via 113 spans between outer edges of two adjacent active regions 106. The dimensions of x1 and s1 has been described previously and can equally apply in FIG. 5A. In an embodiment, a ratio between the via length v1 to the width x1 can range between about 6 to 7. In an embodiment, the width x1 is about 10 nm, the spacing s1 is about 45 nm, and the via length v1 is about 65 nm. Like in FIG. 3A, by having the Vss backside via 113 land on the backside of the shared S/D contact 110, there is improved overlay control and process window. Further, FIG. 5A demonstrates additional benefits since the via length v1 is even larger than the embodiments in FIGS. 3A and 4A. The embodiment in FIG. 5A further reduces contact resistance while providing greater margins for error. In an embodiment, forming the Vss backside via 113 as a slot via (as shown) can reduce the contact resistance by up to 90% as compared to when the via length v1 is about equal to the width x1.

Still referring to FIG. 5A, the gates 108 have a width y1 in the y direction, the shared S/D contact 110 has a width y2 in the y direction, and the Vss backside via 113 has a via width v2 in the y direction. These dimensions, and other related features, are similar to what has been described with respect to FIG. 3A. For the sake of brevity, the similar features will not be repeated again.

Referring now to FIG. 5B, a cross-sectional view of FIG. 5A through the dashed lines B-B' is shown. Features described in FIG. 5A are similarly labeled in FIG. 5B. What has been described in FIG. 5A equally apply in FIG. 5B. Note that there are also additional features shown in FIG. 5B not shown in FIG. 5A.

FIG. 5B is similar to FIG. 4B, and the similar features will not be repeated again for the sake of brevity. The difference is in the backside via 113, which has a trident shape with three penetrating portions 113*a*, 113*b*, and 113*c*. As shown, the backside via 113 has a first portion 113*a* penetrating through the gate insulating structure 111 from a backside. The first portion 113*a* lands on a backside surface of the shared S/D contact 110. This corresponds to the backside via 113 in FIG. 4B. However, in FIG. 5B, the backside via 113 further includes a second portion 113*b* penetrating through a first active region 106 from a backside and a third portion 113*c* penetrating through a second active region 106 from a backside. The second and third portions penetrates through source/drain regions of the active regions 106, and they directly land on respective S/D features 106*a*. Since the second and third portions land on the S/D features 106*a*, each of the S/D features 106*a* may be further lined with a backside silicide layer 216. The respective backside silicide layers 216 are disposed over respective bottom surfaces of the S/D features 106*a*. The backside silicide layers 216 may include similar materials as the frontside silicide layer 116 and they interface between epitaxial features of the S/D features 106*a* and the backside via 113. The first portion 113*a* may have a bigger width along the x direction than the widths of the second and third portions 113*b* and 113*c*. This is because the widths of the second and third portions 113*b* and 113*c* are limited by the width x1 of the active regions 106, and the width of the first portion 113*a* is limited by a spacing between adjacent S/D features 106*a* (e.g., width of the gate insulating structure 111), and the spacing between adjacent S/D features 106*a* is bigger than the width x1 of the active regions 106.

Still referring to FIG. 5B, the backside via 113 further includes a horizontal fourth portion 113*d* that connects the first portion 113*a*, the second portion 113*b*, and the third portion 113*c* together. The horizontal fourth portion 113*d* spans the length v1 (see FIG. 5A) and penetrates through the etch stop layer 129. The horizontal fourth portion 113*d* penetrates a smaller depth than the first, second, and third portions 113*a*, 113*b*, and 113*c*. As such, the first, second, and third portions 113*a*, 113*b*, and 113*c* are laterally distanced from each other in the x direction. For example, as shown, the first, second, and third portions 113*a*, 113*b*, and 113*c* are interposed by various dielectric features (e.g., isolation structures 107, liner barrier layer 117, and the ILD layer 115*a*).

Figures 6A, 6B:
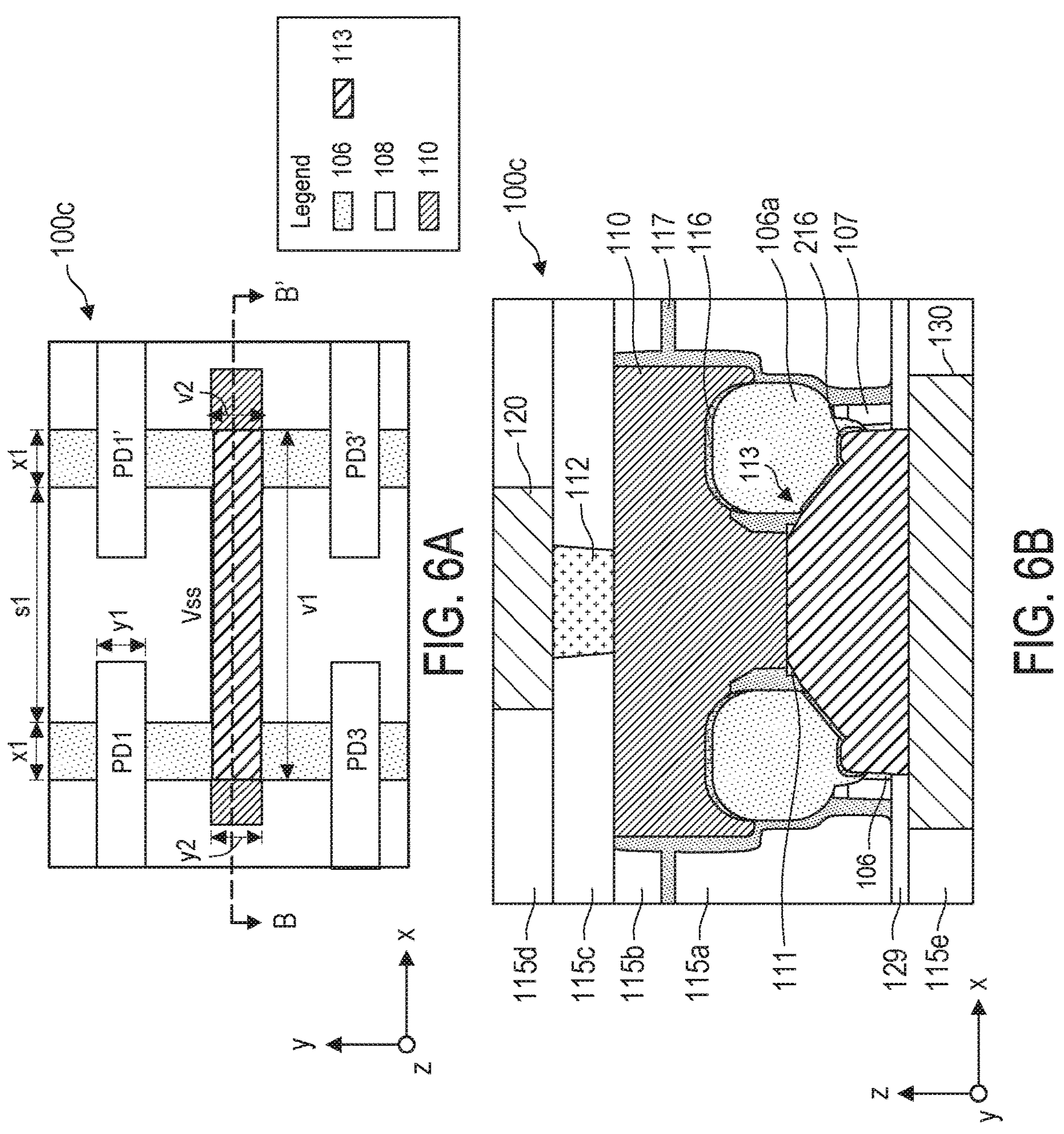
FIG. 6A illustrates a portion of the top view device layout in FIG. 5.
FIG. 6B illustrates a cross-sectional view of a semiconductor device cut along the lines B-B' in FIG. 6A, according to another embodiment of the present disclosure.

FIGS. 6A-6B illustrates another embodiment of the present disclosure illustrating a backside via 113 where the backside via 113 is a slot via. FIG. 6A is the same as FIG. 5A because from a top view, the respective backside vias 113 look the same. As such, the described features will not be repeated again. Referring now to FIG. 6B, a cross-sectional view of FIG. 6A through the dashed lines B-B' is shown. Features in FIG. 6A are similarly labeled in FIG. 6B. What has been described in FIG. 6A equally apply in FIG. 6B. Note that there are also additional features shown in FIG. 6B not shown in FIG. 6A.

FIG. 6B is similar to FIG. 5B, and the similar features will not be repeated again for the sake of brevity. The difference is in the backside via 113, which does not have a trident shape like in FIG. 5B. This is because in FIG. 6B, the backside via 113 penetrates through the various intervening dielectric features (e.g., isolation structures 107, liner barrier layer 117, and the ILD layer 115*a*) such that there is no lateral distance between portions of the backside via 113 that penetrate through active regions 106 and portions of the backside via 113 that penetrates through the gate insulating structure 111. In the embodiment shown, the backside via 113 includes sloped surfaces extending upwards. The sloped surfaces extends upwards along sidewall surfaces of the S/D features 106*a* to a top surface of the backside via 113, where the top surface directly contacts the shared S/D contact 110. Described in another way, referring to FIG. 5B, the sloped surfaces in FIG. 6B may extend from top surfaces of the second and third portions 113*b* and 113*c* to a top surface of the first portion 113*a*. Since the sloped surfaces may also directly contact sidewall surfaces of the S/D features 106*a*, the respective backside silicide layers 216 may further extend along the sloped surfaces. In the embodiment shown, all portions of the backside via 113, at a minimum, penetrates through a depth of the active regions 106.

Figure 7:
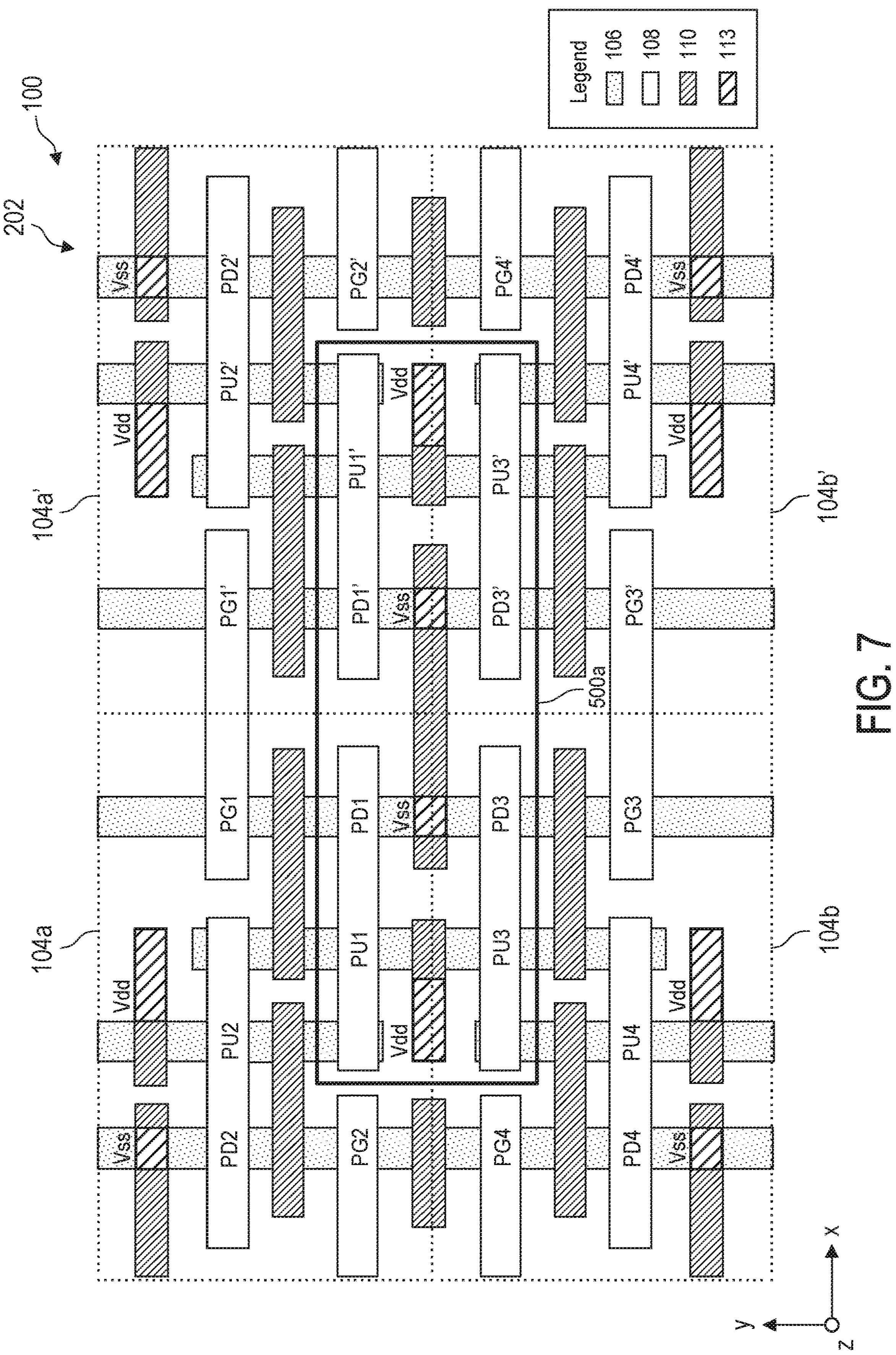
FIG. 7 illustrates a top view device layout showing backside vias of the semiconductor device in FIG. 1, according to another embodiment of the present disclosure.

FIG. 7 illustrates a top view device layout 202 showing backside vias 113 (and other features) of the semiconductor device 100 in FIG. 1, according to another embodiment of the present disclosure. FIG. 7 illustrates a similar top view device layout 202 as those shown in FIGS. 3, 4, and 5, and the similar features will not be repeated again for the sake of brevity.

FIG. 7 shows several S/D contacts 110 landing on source/drain regions of the active regions 106. Some of these S/D contacts 110 land on active regions 106 for various pull-up transistors (i.e., pull-up transistors PU1-PU4 and PU1'-PU4'). Compared with the corresponding S/D contacts 110 in FIGS. 3, 4, and 5, these S/D contacts 110 extend longer in the x direction to prepare for the backside landing of backside vias 113 (i.e., the Vdd backside vias 113). These S/D contacts 110 (now referred to as extended S/D contacts 110) may span a distance along the x direction across two adjacent active regions 106 and a spacing therebetween.

Still referring to FIG. 7, the device layout 202 includes Vss backside vias 113 and Vdd backside vias 113. The Vss backside vias 113 provide backside power line connections to pull-down transistors and the Vdd backside vias 113 provide backside power line connections to pull-up transistors. In an embodiment, the Vss backside vias 113 are electrically connected to ground and the Vdd backside vias 113 are electrically connected to a power source. In another embodiment, the Vss backside vias 113 are electrically connected to a power source and the Vdd backside vias 113 are electrically connected to ground. A semiconductor device 100 may include both Vss and Vdd backside vias 113 as well as Vss and Vdd frontside vias 112 (see FIG. 2) for dual side power configurations. Note that in the embodiment shown in FIG. 7, unlike the embodiments shown in FIGS. 3, 4, and 5, the Vss backside vias 113 do not land on the S/D contacts 110. Instead, they are directly below respective active regions 106, and they penetrate through the active regions 106 from a back side to land on the S/D features 106*a*.

Figures 7A, 7B:
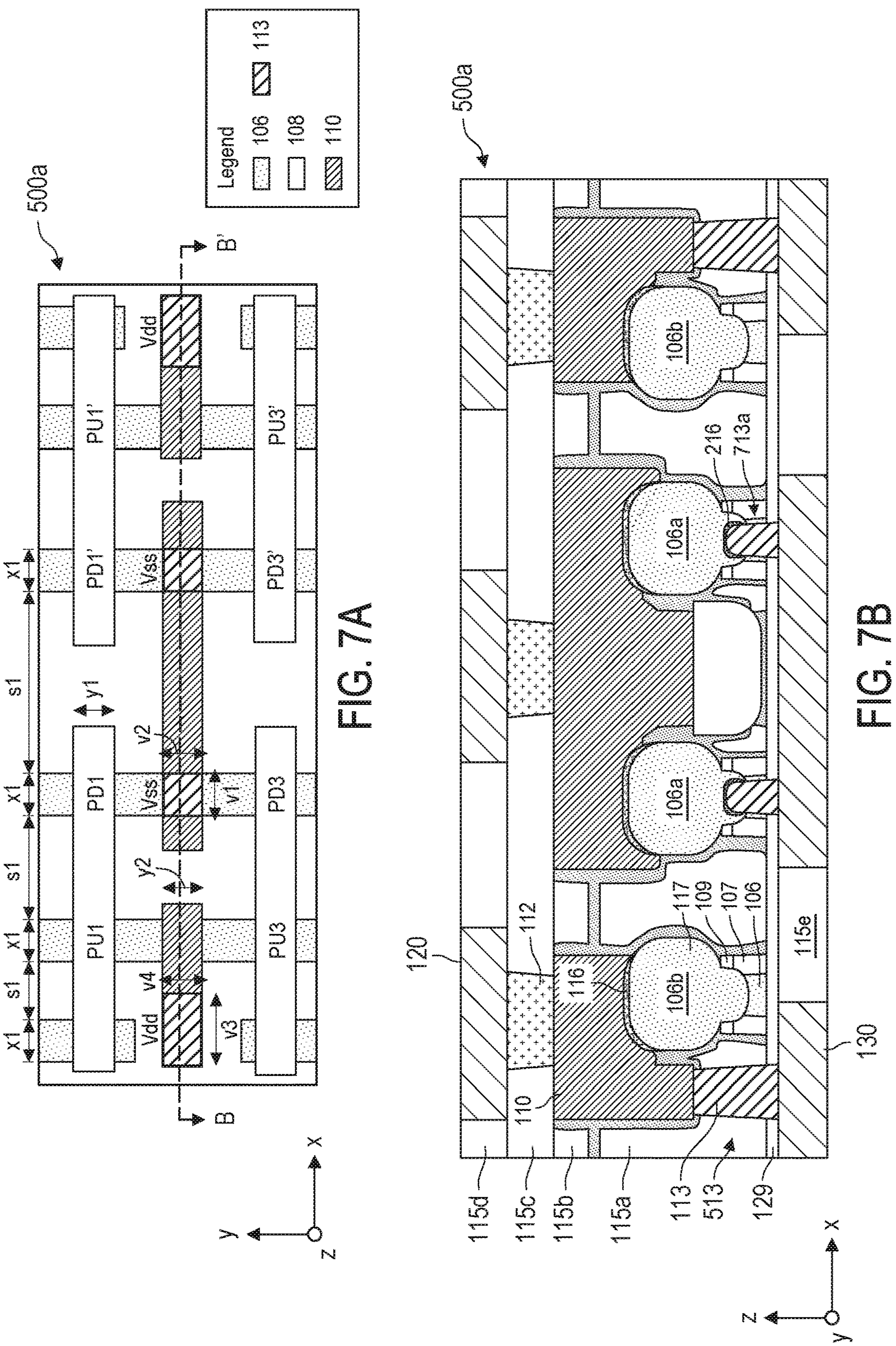
FIG. 7A illustrates a portion of the top view device layout in FIG. 7.
FIG. 7B illustrates a cross-sectional view of a semiconductor device cut along the lines B-B' in FIG. 7A, according to an embodiment of the present disclosure.

FIG. 7 shows a solid black box 500*a* in a middle region of the four SRAM cells to highlight a portion of the semiconductor device 100 having Vss and Vdd backside vias 113. FIG. 7A illustrates the solid black box 500*a* in FIG. 7, and FIG. 7B illustrates a cross-sectional view of a semiconductor device structure corresponding to the solid black box 500*a*, cut along the lines B-B' in FIG. 7A.

Referring to FIG. 7A, several Vdd backside vias 113 are shown. The purpose of the Vdd backside vias 113 is to electrically connect to S/D features 106*b* (see FIG. 7B) from a back side of the semiconductor device 100. This may be achieved by directly contacting the S/D features 106*b* by penetrating through the fin active regions 106 from a back side (not shown), or by directly contacting the extended S/D contacts 110 by penetrating through an ILD layer 115*a* from a back side (shown in FIG. 7B). In the embodiment shown, the Vdd backside vias 113 directly land on a backside of the extended S/D contacts 110 while being spaced away from neighboring fin active regions 106.

Still referring to FIG. 7A, the active regions 106 have a width x1 and they are separated from each other by a spacing s1. FIG. 7A shows s1 having differing lengths between different sets of adjacent active regions 106. However, in other embodiments, the spacing s1 may be constant across all active regions 106. For example, s1 is about 45 nm between any two adjacent active regions 106. The width x1 and the spacing s1 are in the x direction. As shown, a shared S/D contact 110 routing to Vss is sandwiched between two extended S/D contacts 110 routing to Vdd. The shared S/D contact 110 has been described previously and will not be repeated again. Although not shown or drawn to scale, the extended S/D contacts 110 may span a similar length as the shared S/D contact 110. As shown, the extended S/D contacts 110 can span a spacing s1 and beyond outer side surfaces of adjacent active regions 106 on both sides. In other words, the extended S/D contacts 110 has a length in the x direction greater than 2 times x1 plus s1. In an embodiment, a length in the x direction of the shared S/D contacts 110 and the extended S/D contacts 110 is both greater than 60 nm.

Still referring to FIG. 7A, each of the extended S/D contacts 110 has an extended portion that extends in the x direction through a separation spacing in the y direction. The separation spacing is a gap between two active regions 106 in the y direction. As shown, each extended portion may extend beyond outer side surfaces of the corresponding two active regions 106. In other words, each of the extended S/D contacts 110 is directly between two of the active regions 106 along the y direction. As shown, Vdd backside vias 113 are then able to land on the extended portions of the extended S/D contacts 110.

In the embodiment shown, the Vss backside vias 113 have a via length v1 in the x direction and a via width v2 in the y direction. In this embodiment, the via length v1 is limited by the width x1 of the active region. As such, the via length v1 can be about the same as the width x1. The via width v2 has been previously described and equally applies here. Still referring to FIG. 7A, the Vdd backside vias 113 have a via length v3 in the x direction and a via width v4 in the y direction. In the embodiment shown, the via length v3 is equals to or is greater than the width x1. For example, a ratio between the via length v3 to the width x1 is in a range between 1 to 4. The via width v4 may be similar to the via width v2 previously described.

Still referring to FIG. 7A, by having the Vdd backside vias 113 land on the backside of the extended S/D contacts 110, there is improved overlay control and process window. This is because the Vdd backside vias 113 would no longer be limited to the precise location of the fin active regions 106, where any misalignment will cause overlay shift and inadequate landing. In other words, instead of having to penetrate through backside of fin active regions 106, the position of the Vdd backside via 113 is relocated to be adjacent and away the fin active regions 106, thereby achieving overlay improvements. Further, this configuration demonstrates additional benefits by allowing for greater via length v3 for better via penetration and for reduced contact resistance. For example, by increasing the via length v3 to be longer than the width x1, the contact resistance can be reduced by over 50% depending on the amount of via length increase.

Referring now to FIG. 7B, a cross-sectional view of FIG. 7A through the dashed lines B-B' is shown. Features described in FIG. 7A are similarly labeled in FIG. 7B. What has been described in FIG. 7A equally apply in FIG. 7B. Note that there are also additional features shown in FIG. 7B not shown in FIG. 7A. FIG. 7B includes similar features previously described with respect to FIGS. 3B, 4B, 5B, and 6B. The consistent features will not be described again for the sake of brevity. For distinction purposes, the backside vias 113 connecting to Vdd power lines are referred to as Vdd backside vias 513, and the backside vias 113 connecting to Vss power lines are referred to as Vss backside vias 713*a*. The Vdd backside vias 513 correspond to the Vdd backside vias 113 in FIG. 7A, and the Vss backside vias 713*a* correspond to the Vss backside vias 113 in FIG. 7A.

Still referring to FIG. 7B, the Vdd backside vias 513 penetrate through the ILD layer 115*a* from a backside of the semiconductor structure to land on an extended S/D contact 110. The Vdd backside vias 513 may also penetrate through other features (e.g., the etch stop layer 129 and/or liner barrier layers 117). Each of the extended S/D contacts 110 includes an extending portion and a non-extending portion. The extending portion may be thicker in the z direction than the non-extending portion, and the extending portion is where the Vdd backside vias 513 land on. As shown, each extending portion extends beyond a sidewall of an S/D feature 106*b* and has a lower portion directly adjacent to the S/D feature 106*b*. As shown, a bottom surface of the lower portion is below a top surface of the S/D features 106*b*. The non-extending portion of the extended S/D contacts 110 is directly above and may directly contact a top surface of an S/D feature 106*b*. In the present embodiment, the S/D features 106*b* are similar to the S/D features 106*a*, except that the S/D features 106*b* are p-type S/D features for pull-up transistors and they may be doped with p-type dopants such as boron. Like the S/D features 106*a*, each of the S/D features 106*b* may be epitaxially grown from a source/drain region of an active region 106, and the S/D features 106*b* and corresponding active regions 106 may be surrounded by various isolation structures 107, fin spacers 109, and liner barrier layers 117. Similarly, the S/D features 106*b* may be lined with a frontside silicide layer 116. The respective frontside silicide layers 116 are disposed over respective top surfaces of the S/D features 106*b* and they interface between epitaxial features of the S/D features 106*b* and the extended S/D contact 110.

Still referring to FIG. 7B, the Vdd backside vias 513 directly land on backside via rails 130 for further electrical routing on the back side of the semiconductor device. And for dual side power configuration, respective frontside vias 112 directly land on front sides of the extended S/D contacts 110, and frontside via rails 120 directly land on the respective frontside vias 112 for further electrical routing on the front side of the semiconductor device. In this case, these respective frontside vias 112 and the Vdd backside via 113 are on opposite sides of the extended S/D contacts 110. These frontside vias 112 (along with other frontside vias 112) may be surrounded by the ILD layer 115*c*, the frontside via rails 120 may be surrounded by the ILD layer 115*d*, and the backside via rails 130 may be surrounded by the ILD layer 115*e*. As described previously, the ILD layers 115*c*, 115*d*, and 115*e* may have similar material compositions as that of the ILD layers 115*a* and 115*b*. And although not shown, the ILD layers 115*c*, 115*d*, and 115*e* may also be lined with liner barrier layers 117.

Still referring to FIG. 7B, the Vss backside vias 713*a* penetrates through source/drain regions of the active regions 106 to directly land on respective S/D features 106*a*. Since the Vss backside vias 713*a* land on the S/D features 106*a*, each of the S/D features 106*a* may be further lined with a backside silicide layer 216. The respective backside silicide layers 216 are disposed over respective bottom surfaces of the S/D features 106*a*. The backside silicide layers 216 may include similar materials as the frontside silicide layer 116 and they interface between epitaxial features of the S/D features 106*a* and the Vss backside vias 713*a*. Note that because the Vss backside vias 713*a* are limited in size by the active regions 106, the Vss backside vias 713*a* may have a smaller width in the x direction than a width of the Vdd backside vias 513.

Figures 8A, 8B:
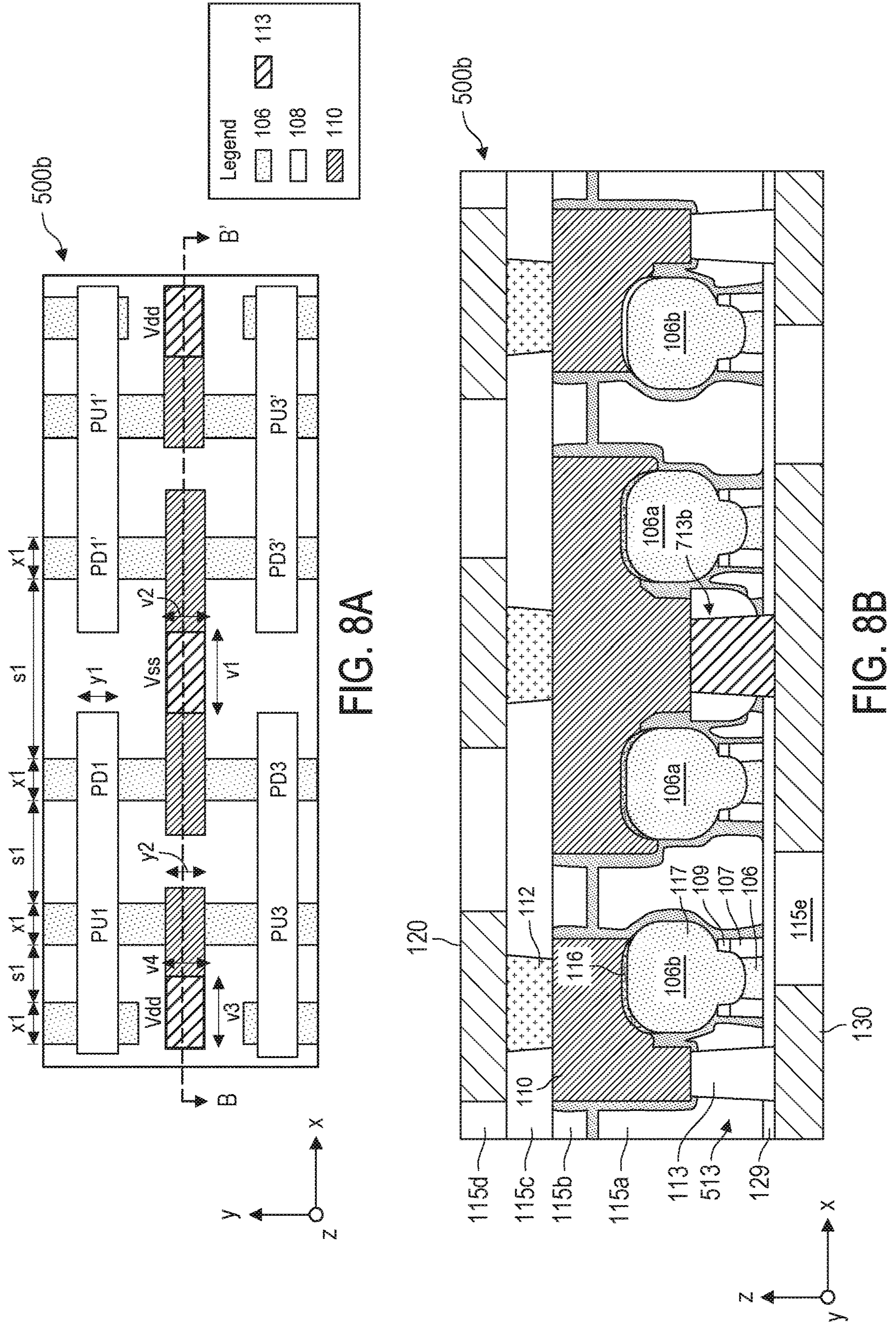
FIG. 8A illustrates a portion of the top view device layout in FIG. 7 in a different embodiment.
FIG. 8B illustrates a cross-sectional view of a semiconductor device cut along the lines B-B' in FIG. 8A, according to an embodiment of the present disclosure.
Figures 9A, 9B:
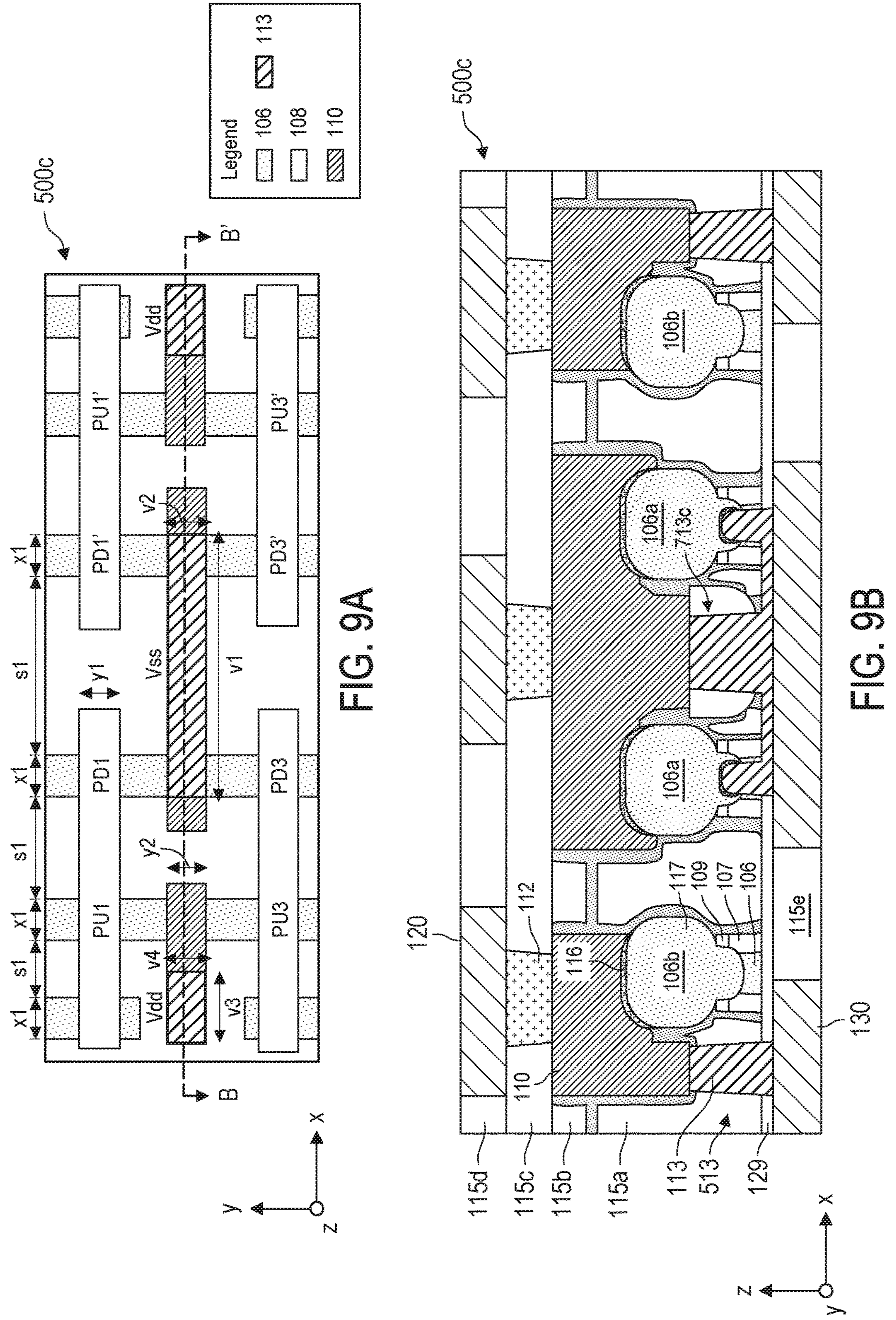
FIG. 9A illustrates a portion of the top view device layout in FIG. 7 in a different embodiment.
FIG. 9B illustrates a cross-sectional view of a semiconductor device cut along the lines B-B' in FIG. 9A, according to an embodiment of the present disclosure.
Figures 10A, 10B:
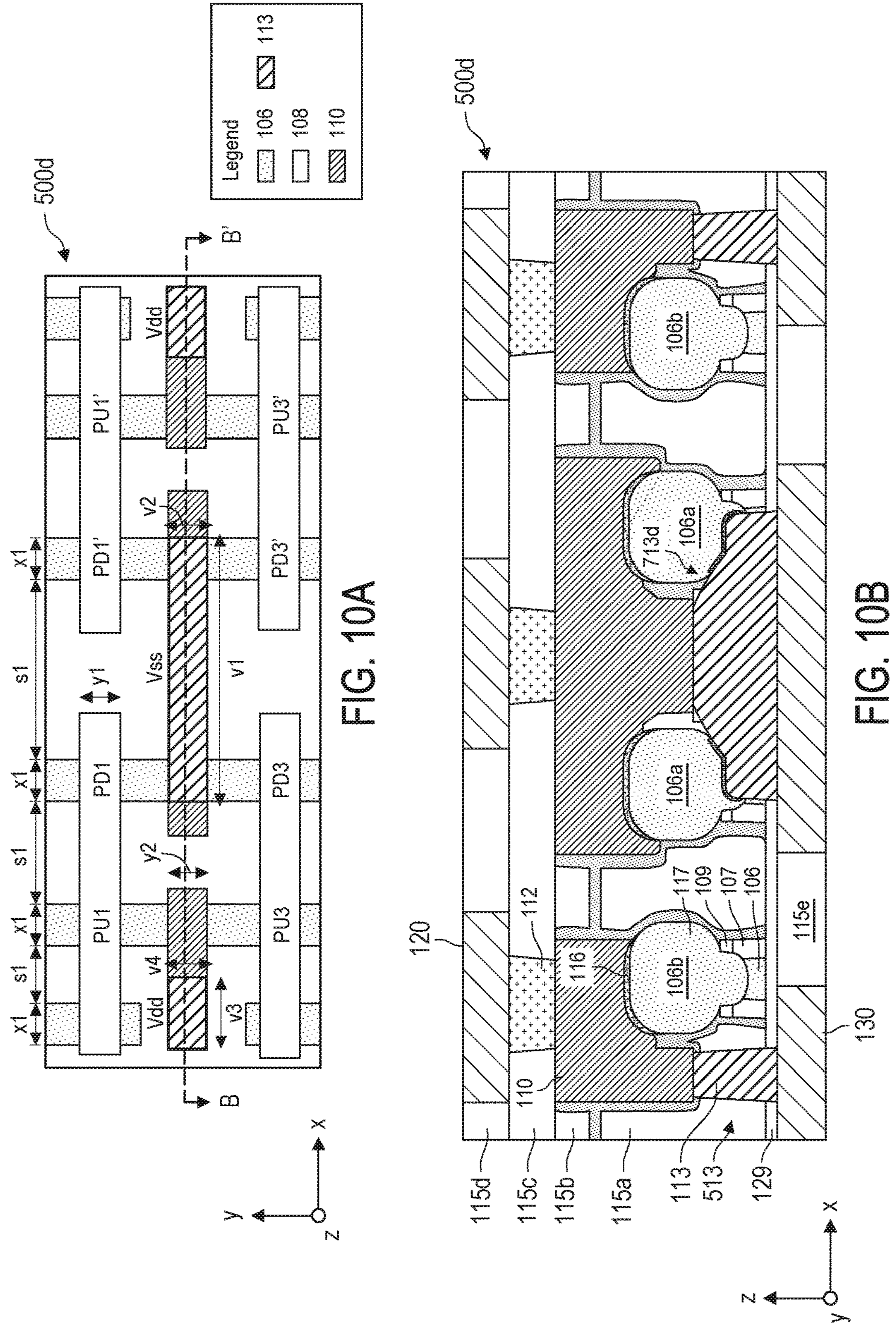
FIG. 10A illustrates a portion of the top view device layout in FIG. 7 in a different embodiment.
FIG. 10B illustrates a cross-sectional view of a semiconductor device cut along the lines B-B' in FIG. 10A, according to an embodiment of the present disclosure.

FIGS. 8A-8B, 9A-9B, and 10A-10B illustrate additional embodiments of the present disclosure, highlighting a portion of the semiconductor device 100 having Vss and Vdd backside vias 113. FIGS. 8A, 9A, and 10A show solid black boxes 500*b*, 500*c*, and 500*d*, respectively, each of which resembles the solid black box 500*a* in FIG. 7A. FIGS. 8B, 9B, and 10B illustrate cross-sectional views of semiconductor device structures corresponding to the solid black boxes 500*b*, 500*c*, and 500*d* cut along the lines B-B' in FIGS. 8A, 9A, and 10A, respectively. Each of FIGS. 8A-8B, 9A-9B, and 10A-10B resembles FIGS. 7A-7B, and the similar features labeled and described will not be repeated again for the sake for brevity. The differences are in the configuration of the Vss backside vias 113. Specifically, the various embodiments of the Vss backside vias 113 described previously can be incorporated in combination with the Vdd backside vias 113 described in FIGS. 7A-7B. For example, in FIGS. 8A-8B, the Vss backside via 113/713*b* corresponds to the Vss backside via 113 as shown and described with respect to FIGS. 4A-4B. In FIGS. 9A-9B, the Vss backside via 113/713*c* corresponds to the Vss backside via 113 as shown and described with respect to FIGS. 5A-5B. In FIGS. 10A-10B, the Vss backside via 113/713*d* corresponds to the Vss backside via 113 as shown and described with respect to FIGS. 6A-6B.

The semiconductor device 100 described herein is formed by a suitable fabrication process. In an embodiment, the fabrication process includes a frontside process and a backside process. The frontside process includes forming fin active regions 106 protruding above isolation structure 107 over a substrate, forming S/D features 106*a* over S/D regions of the fin active regions 106, forming gate structures over channel regions of the fin active regions 106, forming gate insulating structures 111 that cuts through the gate structures to form separate gates 108, forming S/D contacts 110 over the S/D features 106*a*, and forming frontside vias 112 over the S/D contacts 110. The frontside process may further include forming interconnects over the frontside vias 112, where the interconnects may include frontside metal lines such as a frontside via rail 120 that may connect to additional higher level metal lines for frontside power connections. The backside process includes flipping the semiconductor device 100 to thin down the substrate from a backside of the substrate. After thin down, only portions of the fin active regions 106 and the isolation structure 107 remain. The backside process further includes a planarization process and depositing a dielectric layer (e.g., etch stop layer 129) on the backside of the thinned down fin active regions 106 and isolation structure 107. The backside process includes etching from the backside to form backside via trenches exposing bottom surfaces of the S/D contacts 110. The backside via trenches may penetrate through the gate insulating structures 111 and/or other dielectric layers (e.g., the etch stop layer 129, ILD layers 115*a*, or barrier liner layers 117). Backside vias 113 are then formed in the backside via trenches. The backside process may further include forming backside metal lines such a backside via rail 130 that may connect to additional lower level metal lines for backside power connections.

Although not limiting, the present disclosure offers advantages for semiconductor devices and structures (e.g., SRAM devices) having backside vias for backside power connections. One example advantage is relocating the backside vias to land on metal contacts instead of S/D features. This provides overlay improvements since the metal contacts offer more spacing to land than the S/D features. Another example advantage is that the backside vias are formed larger than the critical dimensions of the active region, thereby reducing contact resistance while providing benefits to process window. Another example advantage is providing backside vias of the present disclosure for both Vdd and Vss power connections, thereby improving SRAM performance.

One aspect of the present disclosure pertains to a semiconductor structure. The semiconductor structure includes a first source/drain (S/D) epitaxial feature, a second S/D epitaxial feature adjacent to the first S/D epitaxial feature, an insulating structure between the first and the second S/D epitaxial features, and a shared S/D contact over top surfaces of the first and the second S/D epitaxial features. A center portion of the shared S/D contact is directly between a side surface of the first S/D epitaxial feature and a side surface of the second S/D epitaxial feature. The center portion is directly above the insulating structure. The semiconductor structure further includes a backside via penetrating through the insulating structure to directly land on a bottom surface of the center portion.

In an embodiment, the first and the second S/D epitaxial features are S/D features for pull-down transistors in a static random access memory (SRAM) structure. In an embodiment, the backside via is electrically connected to a power source or to ground.

In an embodiment, the semiconductor structure further includes s frontside via directly landing on a top surface of the shared S/D contact. The frontside via and the backside via are on opposite sides of the shared S/D contact.

In an embodiment, the semiconductor structure further includes fin active regions under the first and the second S/D epitaxial features, the fin active regions extend lengthwise along a first direction, and each of the fin active regions has a fin width along a second direction perpendicular to the first direction. The backside via has a via length along the second direction, and the via length is greater than fin width. In a further embodiment, a ratio of the via length to the fin width is in a range between about 1.5 to about 4. In a further embodiment, the shared S/D contact extends lengthwise along the second direction, and the shared S/D contact has a S/D contact width along the first direction, where the backside via has a via width along the first direction, and a ratio of the via width to the S/D contact width is about equal to or greater than 1. In a further embodiment, the semiconductor structure further includes a dielectric layer under the fin active regions, and the backside via also penetrates through the dielectric layer to land on the bottom surface of the center portion.

In an embodiment, the semiconductor structure further includes a first gate structure over the first S/D epitaxial feature and a second gate structure over the second S/D epitaxial feature. The backside via substantially spans between a gate separation between the first gate structure and the second gate structure along a lengthwise direction of the first and second gate structures.

Another aspect of the present disclosure pertains to a semiconductor structure. The semiconductor structure includes a first source/drain (S/D) epitaxial feature over a first active region, a second S/D epitaxial feature over a second active region adjacent to the first active region, an insulating structure between the first and the second S/D epitaxial features, and a shared S/D contact over top surfaces of the first and the second S/D epitaxial features. A center portion of the shared S/D contact is directly between a side surface of the first S/D epitaxial feature and a side surface of the second S/D epitaxial feature, where the center portion is directly above the insulating structure. The semiconductor structure further includes a backside via having a first portion penetrating through the insulating structure to directly land on a bottom surface of the center portion, a second portion penetrating through the first active region to directly land on the first S/D epitaxial feature, and a third portion penetrating through the second active region to directly land on the second S/D epitaxial feature.

In an embodiment, the semiconductor structure further includes frontside silicide layers between the first S/D epitaxial feature and the shared S/D contact and between the second S/D epitaxial feature and the shared S/D contact, and backside silicide layers between the first S/D epitaxial feature and the second portion of the backside via and between the second S/D epitaxial feature and the third portion of the backside via.

In an embodiment, the first portion of the backside via has a first width along a first direction, the second portion of the backside via has a second width along the first direction, the third portion of the backside via has a third width along the first direction, and the first width is greater than the second width and greater than the third width. In a further embodiment, the backside via further comprises a horizontal fourth portion that connects the first, second, and third portions together, and the first, second, and third portions are laterally distanced from each other. In a further embodiment, the first and second active regions have a fin width along the first direction, the first active region is spaced away from the second active region by a fin spacing along the first direction, the horizontal fourth portion has a backside via length about equal to two times the fin width plus the fin spacing.

In an embodiment, the backside via has a sloped surface extending upwards from a top surface of the second portion to a top surface of the first portion.

Another aspect of the present disclosure pertains to a semiconductor structure. The semiconductor structure includes a source/drain (S/D) epitaxial feature over an active region, an S/D contact over a top surface of the S/D epitaxial feature, where the S/D contact has an extending portion that extends lengthwise beyond a sidewall of the S/D epitaxial feature. The semiconductor structure further includes an interlayer dielectric (ILD) layer surrounding the active region, the S/D epitaxial feature, and the S/D contact, and a backside via penetrating through the ILD layer to directly land on a bottom surface of the extending portion.

In an embodiment, the active region has a first width along a first direction, the backside via has a second width along the first direction, and the second width is greater than the first width.

In an embodiment, the S/D contact has a non-extending portion directly above the top surface of the S/D epitaxial feature, and the non-extending portion has a first thickness in a vertical direction. The extending portion has a second thickness in the vertical direction, and the second thickness is greater than the first thickness.

In an embodiment, the active region is a first active region, and the semiconductor structure further includes a second active region adjacent the first active region on a first side and a third active region adjacent the first active region on the first side. The third active region is spaced away from the second active region by a gap along a first direction. And from a top view, the extending portion extends beyond the second active region and the third active region along a second direction perpendicular to the first direction, and the extending portion extends through the gap between the second active region and the third active region.

In an embodiment, the S/D epitaxial feature is a first S/D epitaxial feature, the active region is a first active region, the S/D contact is a first S/D contact, and the backside via is a first backside via, and the semiconductor structure further includes a second S/D epitaxial feature over a second active region, a third S/D epitaxial feature over a third active region adjacent to the second active region, a shared S/D contact over top surfaces of the second and third S/D epitaxial features, and a backside via directly landing on a bottom surface of the shared S/D contact.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:

a first source/drain (S/D) epitaxial feature;

a second S/D epitaxial feature adjacent to the first S/D epitaxial feature;

an insulating structure between the first and the second S/D epitaxial features;

a shared S/D contact over top surfaces of the first and the second S/D epitaxial features, wherein a center portion of the shared S/D contact is directly between a side surface of the first S/D epitaxial feature and a side surface of the second S/D epitaxial feature, wherein the center portion is directly above the insulating structure; and a backside via penetrating through the insulating structure to directly land on a bottom surface of the center portion.

2. The semiconductor structure of claim 1, wherein the first and the second S/D epitaxial features are S/D features for pull-down transistors in a static random access memory (SRAM) structure.

3. The semiconductor structure of claim 1, wherein the backside via is electrically connected to a power source or to ground.

4. The semiconductor structure of claim 1, further comprising:

a frontside via directly landing on a top surface of the shared S/D contact, wherein the frontside via and the backside via are on opposite sides of the shared S/D contact.

5. The semiconductor structure of claim 1, further comprising:

fin active regions under the first and the second S/D epitaxial features, the fin active regions extend lengthwise along a first direction, and each of the fin active regions has a fin width along a second direction perpendicular to the first direction, wherein the backside via has a via length along the second direction, and the via length is greater than fin width.

6. The semiconductor structure of claim 5, wherein a ratio of the via length to the fin width is in a range between about 1.5 to about 4.

7. The semiconductor structure of claim 5, wherein the shared S/D contact extends lengthwise along the second direction, and the shared S/D contact has a S/D contact width along the first direction, wherein the backside via has a via width along the first direction, and a ratio of the via width to the S/D contact width is about equal to or greater than 1.

8. The semiconductor structure of claim 5, further comprising:

a dielectric layer under the fin active regions, wherein the backside via also penetrates through the dielectric layer to land on the bottom surface of the center portion.

9. The semiconductor structure of claim 1, further comprising:

a first gate structure over the first S/D epitaxial feature; and a second gate structure over the second S/D epitaxial feature, wherein the backside via substantially spans between a gate separation between the first gate structure and the second gate structure along a lengthwise direction of the first and second gate structures.

10. A semiconductor structure, comprising:

a first source/drain (S/D) epitaxial feature over a first active region;

a second S/D epitaxial feature over a second active region adjacent to the first active region;

an insulating structure between the first and the second S/D epitaxial features;

a shared S/D contact over top surfaces of the first and the second S/D epitaxial features, wherein a center portion of the shared S/D contact is directly between a side surface of the first S/D epitaxial feature and a side surface of the second S/D epitaxial feature, wherein the center portion is directly above the insulating structure; and a backside via having a first portion penetrating through the insulating structure to directly land on a bottom surface of the center portion, a second portion penetrating through the first active region to directly land on the first S/D epitaxial feature, and a third portion penetrating through the second active region to directly land on the second S/D epitaxial feature.

11. The semiconductor structure of claim 10, further comprising:

frontside silicide layers between the first S/D epitaxial feature and the shared S/D contact and between the second S/D epitaxial feature and the shared S/D contact; and backside silicide layers between the first S/D epitaxial feature and the second portion of the backside via and between the second S/D epitaxial feature and the third portion of the backside via.

12. The semiconductor structure of claim 10, wherein the first portion of the backside via has a first width along a first direction, the second portion of the backside via has a second width along the first direction, the third portion of the backside via has a third width along the first direction, and the first width is greater than the second width and greater than the third width.

13. The semiconductor structure of claim 12, wherein the backside via further comprises a horizontal fourth portion that connects the first, second, and third portions together, and the first, second, and third portions are laterally distanced from each other.

14. The semiconductor structure of claim 13, wherein the first and second active regions have a fin width along the first direction, wherein the first active region is spaced away from the second active region by a fin spacing along the first direction, wherein the horizontal fourth portion has a backside via length about equal to two times the fin width plus the fin spacing.

15. The semiconductor structure of claim 10, wherein the backside via has a sloped surface extending upwards from a top surface of the second portion to a top surface of the first portion.

16. A semiconductor structure, comprising:

a first source/drain (S/D) epitaxial feature over a first active region;

a second S/D epitaxial feature over a second active region adjacent to the first active region;

an insulating structure between the first and the second S/D epitaxial features;

a shared S/D contact over top surfaces of the first and the second S/D epitaxial features, wherein a center portion of the shared S/D contact is directly between a side surface of the first S/D epitaxial feature and a side surface of the second S/D epitaxial feature, wherein the center portion is directly above the insulating structure; and a backside slot via landing on bottom surfaces of the shared S/D contact, the first S/D epitaxial feature, and the second S/D epitaxial feature, wherein the backside slot via has a coplanar bottom surface.

17. The semiconductor structure of claim 16, wherein the backside slot via includes a first portion penetrating through the insulating structure to land on a bottom surface of the center portion, a second portion penetrating through the first active region to land on the first S/D epitaxial feature, and a third portion penetrating through the second active region to land on the second S/D epitaxial feature, wherein the first, second, and third portions are laterally distanced from each other, wherein the backside slot via further includes a horizontal fourth portion that connects the first, second, and third portions together.

18. The semiconductor structure of claim 17, wherein the first portion has a greater width along a first direction than widths of the second and the third portions.

19. The semiconductor structure of claim 16, further comprising:

a frontside via landing on a top surface of the shared S/D contact, wherein the frontside via and the backside slot via are on opposite sides of the shared S/D contact.

20. The semiconductor structure of claim 16, wherein the first and the second S/D epitaxial features are S/D features for pull-down transistors in a static random access memory (SRAM) structure.

* * * * *